(12) United States Patent
Fraboulet et al.

(10) Patent No.: US 6,998,310 B2
(45) Date of Patent: Feb. 14, 2006

(54) PROCESSES FOR MAKING A SINGLE ELECTION TRANSISTOR WITH A VERTICAL CHANNEL

(75) Inventors: David Fraboulet, La Croix de Chorres (FR); Simon Deleonibus, Claix (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 10/491,265

(22) PCT Filed: Oct. 2, 2002

(86) PCT No.: PCT/FR02/03354

§ 371 (c)(1),
(2), (4) Date: Mar. 30, 2004

(87) PCT Pub. No.: WO03/030266

PCT Pub. Date: Apr. 10, 2003

(65) Prior Publication Data

US 2004/0238808 A1    Dec. 2, 2004

(30) Foreign Application Priority Data

Oct. 4, 2001   (FR) ................................. 01 12755

(51) Int. Cl.
*H01L 21/336* (2006.01)

(52) U.S. Cl. ...................... 438/268; 438/962
(58) Field of Classification Search ............ 438/151, 438/268, 285, 590, 962; 257/15, 17, 20, 257/24, 30, 66

See application file for complete search history.

(56) References Cited

U.S. PATENT DOCUMENTS

| 5,545,586 A | 8/1996 | Koh |
| 5,604,154 A * | 2/1997 | Takahashi et al. ........... 438/151 |
| 5,899,734 A | 5/1999 | Lee |
| 5,905,273 A * | 5/1999 | Hase et al. .................... 257/24 |
| 6,221,720 B1 | 4/2001 | Fukuda ........................ 438/268 |
| 6,573,527 B1 * | 6/2003 | Sugiyama et al. ............. 257/17 |

FOREIGN PATENT DOCUMENTS

WO   WO 01/06542   1/2001

OTHER PUBLICATIONS

Huang, "Control of Interdot Space and Dot Size in a Two-Dimensional Gold Nanodot Array", Jpn. J. Appl. Phys., vol. 38 (1999), pp. L473-L476.*

(Continued)

*Primary Examiner*—Chandra Chaudhari
(74) *Attorney, Agent, or Firm*—Thelen Reid & Priest LLP

(57) ABSTRACT

This invention relates to a process for a manufacturing a Coulomb blockade transistor. The process comprises the following steps in sequence: deposition on an insulating substrate of a source layer, a tunnel-insulating layer and an alternating stack of at least one conducting layer and at least one insulating layer, a first etching of the stack to form a filiform tab, coating of the filiform tab with an electrically insulating coating material, a second etching of the tab of the stack to form a pillar, the second etching preserving the coating material to define a groove on each side of the pillar, the formation of at least one isolated grid in the groove, and the formation of a drain in contact with one end of the pillar opposite the source layer, through at least one tunnel-insulating layer.

8 Claims, 21 Drawing Sheets

OTHER PUBLICATIONS

Austing, D.G. et al., "Multiple-Gated Submicron Verticle Tunnelling Structures", Semiconductor Science and Technology, vol. 12, No. 5, pp. 631-636, 1997.

Huang, Shujuan et al., "Control of Interdot Space and Dot Size in a Two-Dimensional Gold Nanodot Array", Japanese Journal of Applied Physics, vol. 38, No. 4B, Part 2, pp. L473-L476, Apr. 15, 1999.

International Search Report, for International Application No. PCT/FR02/03354, date mailed Feb. 6, 2003.

* cited by examiner

PROCESSES FOR MAKING A SINGLE ELECTRON TRANSISTOR WITH A VERTICAL CHANNEL

TECHNICAL FIELD

This invention relates to a Single Electron Transistor (SET). It also relates to processes for making such transistors.

Single electron transistors are also called Coulomb blockade transistors. They have an extremely thin channel which is like a quantum box, and which is connected to a source and to a drain through tunnel junctions. The channel conduction is modified significantly depending on whether or not a weak charge of the order of the charge of one electron is "stored" in the quantum box.

The invention is generally used in applications in electronics fields, and particularly for making integrated circuits including switching transistor or memory structures.

STATE OF PRIOR ART

The state of the art according to the invention is illustrated in documents (1), (2) and (3), that are referenced at the end of this description.

There are a number of difficulties in making single electron transistors. One of these difficulties is the difficulty in making a sufficiently thin channel. Another difficulty is related to the association of the source, drain and grid with the channel.

The electrical capacitance between firstly the source and the drain, and secondly the channel must be as low as possible. This is necessary to enable high operating frequencies of the transistor. On the other hand, the capacitance between the channel and the grid must be high to give good transistor control.

PRESENTATION OF THE INVENTION

The purpose of this invention is to propose a Coulomb blockade transistor and processes for making such a transistor capable of overcoming the difficulties mentioned above.

One purpose of the invention is particularly to propose a transistor with weak drain-channel and source-channel junction capacitances while guaranteeing a high grid-channel capacitance.

Another purpose is to propose reliable and reproducible processes for making the transistor.

Another purpose of the invention is to propose processes adapted to collective fabrication of a large number of transistors, possibly connected in switching or memory circuits.

To achieve these purposes, the invention more precisely relates to Coulomb blockade transistors comprising the following on a substrate:
  a stack of channel layers forming at least one quantum box,
  a source and a drain connected to the quantum box through tunnel junctions, at least one which is distinct from the layers of the stack, and stacked with the channel layers,
  at least one grid facing at least one flank of the stack.

According to one characteristic of the transistor, the stack of channel layers comprises one or several nanometric islands of conducting material arranged between electrically insulating layers.

The transistor has a high grid-channel capacitance, due to the stack of channel layers, in other words the arrangement of the channel perpendicular to the substrate, and due to the arrangement of the grid(s) on the flanks of the channel. Furthermore, the source-channel or drain-channel capacitances can be made very small due to the source and drain stack with the channel layers.

The term "conducting" used to qualify the material from which islands are composed, is considered as being conducting in opposition to dielectric materials. Therefore, it may either be a conducting material such as a metal, or a semi conducting material that can form the quantum box. The conducting material may be in the form of a continuous layer or it may be in the form of granular particles encased in an insulating material. For example, the islands may be formed from semi conducting nanocrystals (silicon) or metallic grains (aluminium).

The Coulomb blockade effect can be accentuated by putting several quantum boxes in series, in other words by repeating the conducting material/insulating material alternations in the stack of the channel.

One first process for manufacturing a transistor as described above could comprise the following steps in sequence, in accordance with the invention:
  deposition on an insulating substrate of a source layer, a tunnel-insulating layer and an alternating stack of at least one conducting layer and at least one insulating layer,
  a first final etching of the stack to form a filiform tab,
  coating of the filiform tab with an electrically insulating coating material,
  a second final etching of the tab of the stack to form a pillar, the second etching preserving the coating material to define grooves on each side of the pillar,
  the formation of at least one grid isolated in the grooves,
  the formation of a drain in contact with one end of the pillar opposite the source layer, through at least one tunnel-insulating layer.

The source and drain regions in field effect transistors are usually interchangeable. This is also true for the transistor according to the invention. Thus, the source layer mentioned in the process can be used as a drain and the drain formed on the stack can be used as a source.

Furthermore, the term "final etching" is used to denote etching at the limits of the resolution of lithography techniques. The shape of a filiform tab is the best shape for final etching. For example, tabs with a width parallel to the substrate of less than or equal to 5 nm can be etched in the stack.

The pillar is the result of the combination of the two etchings. The two etchings preferably use filiform masks and the pillar corresponds to a position which is covered by each of the masks in sequence. The smallest dimensions for the section of the pillar are obtained when the directions of the filiform masks are perpendicular to each other in planes parallel to the surface of the substrate.

The coating material performs three functions, firstly electrical insulation, secondly mechanical support of the very thin pillar, and finally formation of a mould, in fact grooves for subsequent manufacturing of one or several grids.

The process as described above may be completed by steps, known in themselves, for forming connection terminals for creating a contact on the grid, on the source layer and on the drain.

The grid(s) formed on each side of the pillar is (are) isolated grids. They are electrically isolated from the stack, but also from the very close source and drain. For example, formation of the grid may include deposition in the grooves of a grid insulating material of a contact layer and of a grid material, and then making these layers plane and stopping on the pillar.

Advantageously, planing may take place stopping on a portion of a template layer used as an etching mask during the first etching, and preserved at the top of the pillar. The same material may also be preserved in a region external to the transistor-manufacturing region to make it easier to stop planing.

In accordance with one variant of the invention, the manufacturing process for a transistor as described above may also include the following steps in sequence:

deposition of a source layer, a tunnel-insulating layer and an alternating stack of at least one conducting layer and at least one insulating layer, on an insulating substrate, a first etching of the stack according to a template layer to form a strip, coating of the strip with an electrically insulating coating material, a second etching of the strip in the stack to form a column, the second etching preserving the coating material to define grooves on each side of the column, and the second etching protecting a part of the template layer on the column, formation of at least one isolated grid in the grooves, withdrawal of the template layer to expose part of the isolated grid and formation of at least one spacer extending partially on the column, in contact with the isolated grid, etching of the column, using the spacer as an etching mask, so as to preserve at least part of the column located under the spacer, cutting of pillars in the preserved part of the column, insulating coating of the pillars, and formation of at least one drain in contact with at least one end of a pillar, opposite the source layer, through at least one tunnel-insulating layer.

The terms "strip" and "column" are used in contrast to "tab" and "pillar" to mean that they are not necessarily the result of final etchings. The dimensions of the finally obtained pillars are always very small, are not dictated by the width of the strip or the dimensions of the column. At least one dimension of pillars is fixed by the width of lateral spacers formed in sequence on the grid(s). The lateral spacers may be obtained in a manner known in itself by conform deposition of a layer of material and then anisotropic etching of this layer to eliminate all parts parallel to the surface of the substrate. The width of the spacers, and therefore one of the dimensions of the pillars, depend on the width of the spacers, in other words particularly on the etching duration and the thickness of the deposited material layer.

Note that the process may be used by forming several pillars, several grids and several drains. Different possibilities for cutting pillars are also proposed.

According to a first possibility, cutting of pillars in the preserved part of the column may include:

formation of one sacrificial pad of mask material above the preserved part of the column, with at least one flank defining an edge of at least one pillar to be formed, formation of at least one spacer on the flank of the sacrificial pad, etching of the preserved part of the column, using the spacer of the sacrificial pad as an etching mask, to preserve the pillar under the spacer.

The spacer can define a second edge of the pillar or it can extend above the coating material.

The sacrificial pad may be used only for manufacturing spacers. In this case, it is preferably eliminated before etching of the pillars. However, the pillars stand without any lateral mechanical support until they are coated, and are therefore fairly fragile.

This is why according to one improvement, it is also possible to cut out pillars in two steps, including an intermediate consolidation. In this case, the etching comprises:

a first etching using the sacrificial pad and the spacer of the pad as the etching mask, consolidation of the remaining part of the column by an electrically insulating material, elimination of the sacrificial pad, preserving the spacer of the sacrificial pad, and a second etching using the spacer of the sacrificial pad as a mask to define at least one pillar.

The process continues as described above by coating and isolating the pillars. These operations may take place by covering the free lateral faces of the pillars with an insulating material that then acts as a mechanical support and electrical insulation. For example, the material used could be the same as the material used for intermediate consolidation.

Other characteristics and advantages of the invention will become clearer from the following description with reference to the figures in the appended drawings. This description is given purely for illustrative purposes and is in no way restrictive.

DETAILED DESCRIPTION OF EMBODIMENTS OF THE INVENTION

In the following description, identical, similar or equivalent parts in the different figures are marked by the same reference symbols to facilitate comparison between the figures. Furthermore, for reasons of clarity, not all elements are shown at the same scale.

Figure 1:
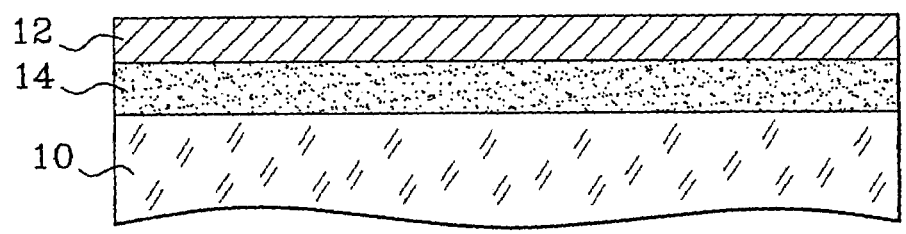
FIG. 1 is a diagrammatic section through a substrate used for manufacture of a transistor according to the invention.

FIG. 1 shows the structure of a substrate used for manufacturing a transistor according to the invention. It is an SOI (Silicon On Insulator) type substrate.

The substrate comprises a layer 10 of solid silicon used as a support, and a surface layer made of monocrystalline silicon 12, which is of the order of 1 to 200 nm thick. The surface layer 12 is bonded to the solid layer 10 through a buried insulating layer 14. The buried layer 14 may for example be a silicon oxide layer, and is of the order of 10 to 400 nm thick.

Figure 2:
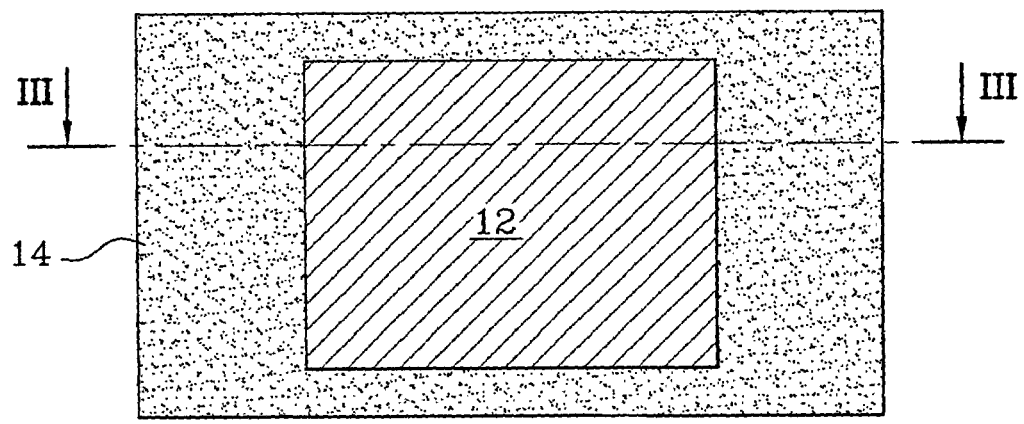
FIG. 2 is a top view of the substrate in FIG. 1.

FIG. 2, which is a top view of the substrate in FIG. 1, shows a first etching operation of the surface layer to delimit it and to form a source of the future transistor. In the remainder of the text, reference 12 is reserved for this part of the surface layer that is denoted as the "source layer".

Figure 3:
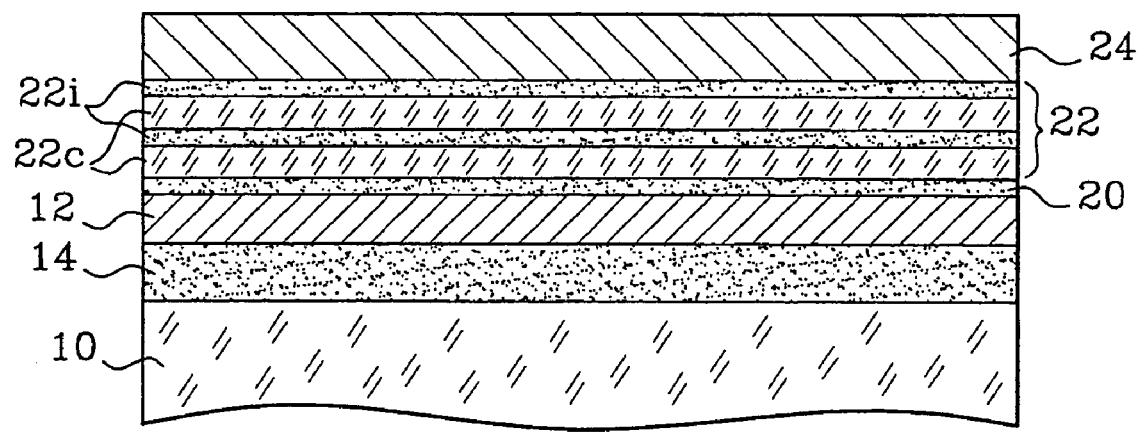
FIG. 3 is a diagrammatic section (III—III) at a larger scale through a central part of the device in FIG. 2 in which a stack of layers has been formed.

As shown in FIG. 3, the process is continued by the formation of a thin tunnel-insulating layer 20, an alternating stack 22 of thin conducting layers 22c, thin insulating layers 22i and a so-called template layer 24, which is also insulating, on the source layer 12. In this example, the template layer 24 is a layer of silicon nitride.

The thin layers 22c and 22i are of the order of one nanometer thick, like the tunnel-insulating layer 20. For example, they may be silicon layers in continuous or granular form alternating with silicon oxide layers. The choice of materials and the thickness of the stack layers are adapted for the subsequent formation of quantum boxes. They are sufficiently thin to enable electrons to pass by the tunnel effect when the transistor is correctly polarised.

Note that FIG. 3, which is a section along plane III—III indicated in FIG. 2, does not represent the entire substrate in FIG. 2, but only the central part which is the part coincident with the limits of the source layer 12.

Figure 4:
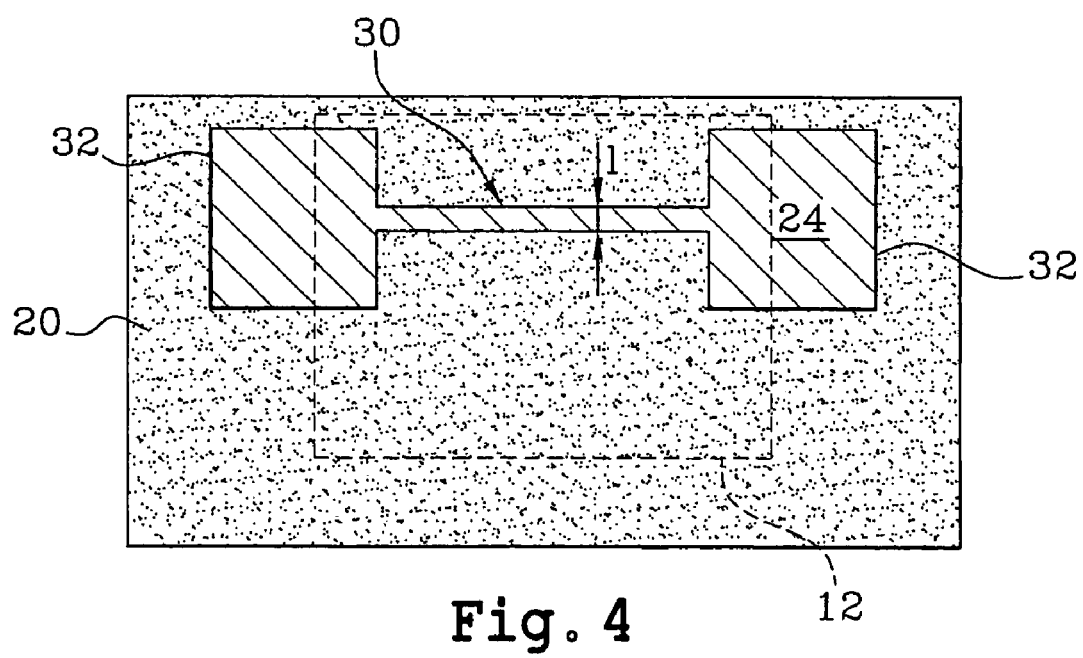
FIG. 4 is an enlarged top view of the device in FIG. 3 after a first etching.

FIG. 4 is a top view of the device. It shows the result of a first lithography and a final etching step. The final etching is designed to form a filiform tab 30 in the stack. The tab 30 has a width 1 in a plane parallel to the surface of the substrate which is less than 50 nm and is preferably of the order of 5 nm. Filiform etching methods are capable of making such narrow widths precisely. The pattern is dictated by an etching mask, not shown, conventionally formed by lithography. The filiform part of the stack is delimited by widened terminal parts 32, for which the function will be described later.

The anisotropic final etching in this example is made by stopping on the tunnel-insulating layer 20. It may be a single etching or etching in several steps, so as to adapt the etching agents to the different layers to be eliminated.

Etching may be stopped either by the choice of selective etching agents, in other words agents that attack materials in the different layers with different reaction speeds, or by adjusting the layer thicknesses. Thus, a thicker layer can be used as a stop layer for etching a thinner layer even if the selectivity of the etching agents is not very good.

In this example, the tunnel-insulating layer 20 is not very thick and therefore does not form a very good etching stop layer. However, as described in the remainder of the text, penetration of this layer during etching does not prevent correct operation of the transistor.

Figure 5:
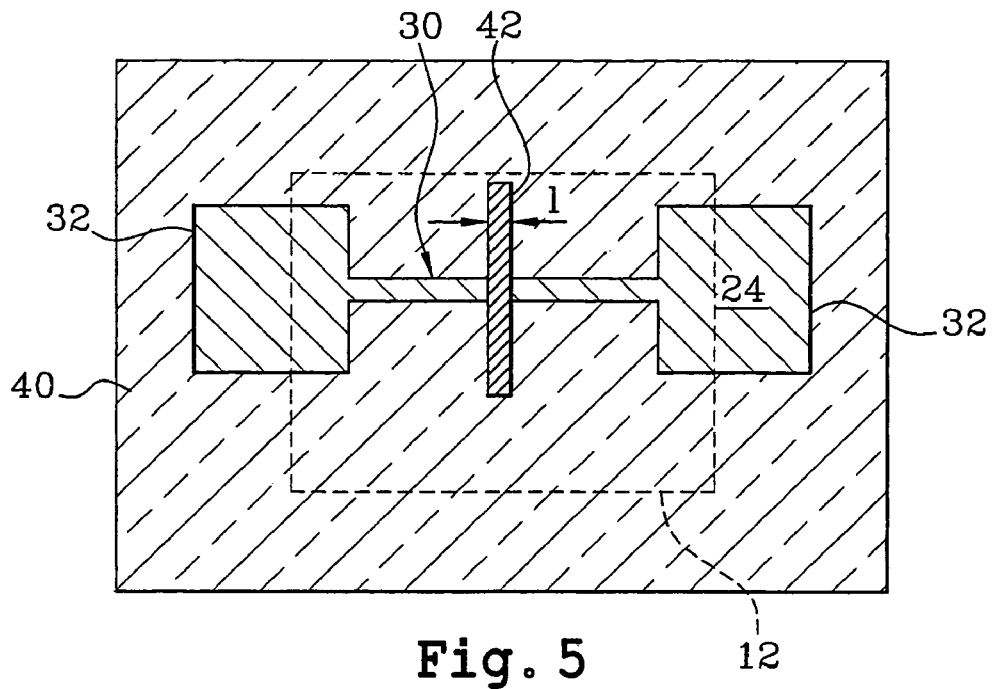
FIG. 5 is a top view of the device in FIG. 4 and illustrates the formation of a second etching mask.

FIG. 5 shows the formation of an electrically insulating coating layer 40. For example, it may be a glass or silicon oxide layer deposited on the entire substrate. It coats and covers the tab 30 that has just been etched in the stack in a conform manner.

The coating layer is planed, for example by polishing, stopping on the template layer 24. Planing results in a plane upper face on which the template layer is exposed at the top of the stack.

A discontinuous line indicates the limits of the source layer 12.

As also shown in FIG. 5, a second filiform etching mask 42 is then formed on the top face of the device. Like the mask that was used to etch the tab previously, the mask 42 is a filiform mask, for example a resin mask not more than 50 nm wide. The second etching mask is placed so as to cross the filiform tab 30 of the stack and preferably to cross it approximately perpendicular to it.

Figure 6:
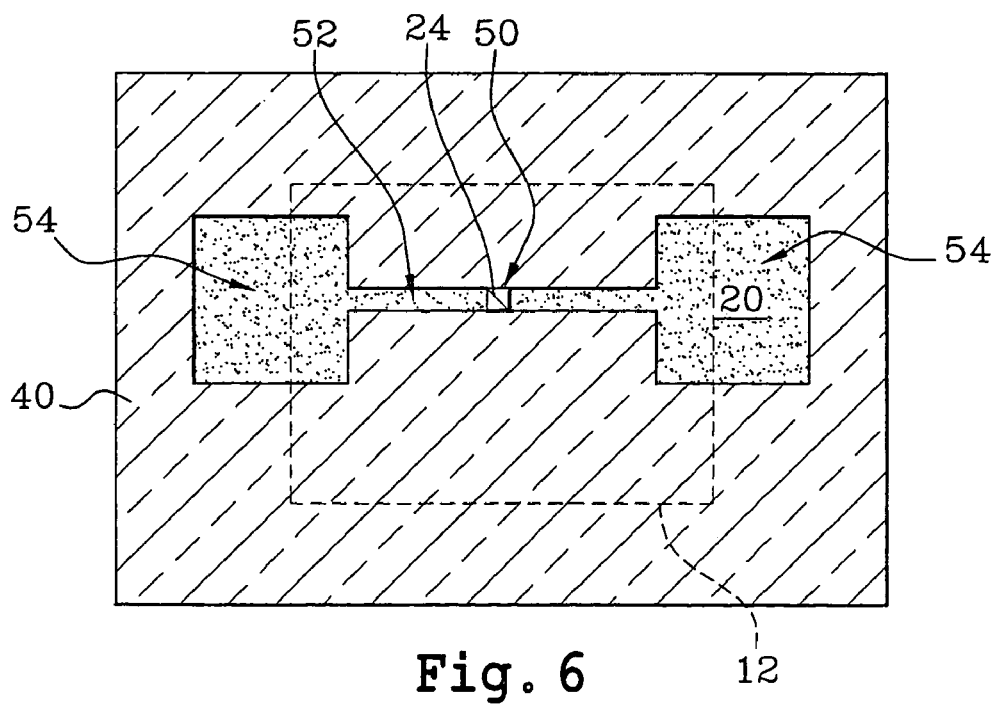
FIG. 6 is a top view of the device in FIG. 5 after a second etching.

After formation of the mask, the substrate is subjected to a second final etching. The second etching is also a selective anisotropic etching that eliminates the stack outside the small region protected by the second mask 42. The stack is etched again stopping on the tunnel-insulating layer 20. FIG. 6 shows the device obtained after withdrawal of the second etching mask.

All that remains of the stack of layers is a pillar 50. The pillar 50 is placed in the middle of a groove 52 for which the side walls are formed by the flanks of the coating layer 40, exposed during the second etching. The grooves open up into wells 54, also called grid wells, the location of which corresponds to the enlarged end parts of the stack.

Figure 7:
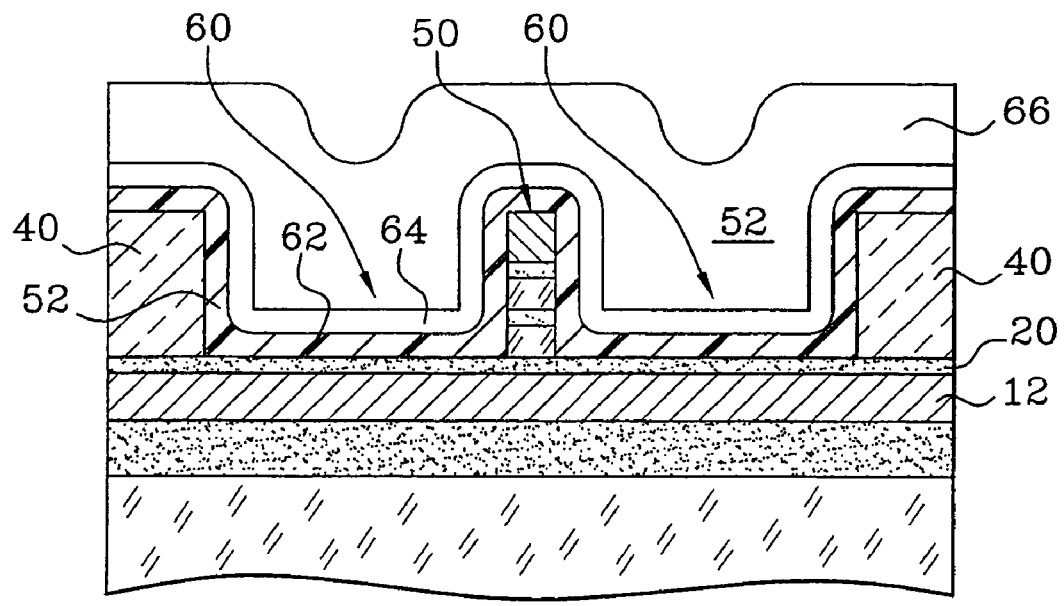
FIG. 7 is a diagrammatic section through the device in FIG. 6 and illustrates an intermediate step in manufacturing an isolated grid.

FIG. 7 is a section through the device in FIG. 6 along the groove 52, and shows the formation of isolated grids 60 in the groove. For reasons of simplification and clarity in the figure, the central part is shown at a larger scale. Similarly, the groove 52 is shown shorter than it really is and the grid wells are not shown. Since the groove extends from one side of the pillar to the other, it can be considered that the transistor has two grids. It can also be considered that it is a single grid in two parts to which identical polarisation voltages may or may not be applied during operation.

The formation of isolated grids includes the successive deposition of a layer of grid insulation 62, followed by one or several layers of grid material. In the example illustrated, the deposition of the grid insulation, for example silicon oxide, is followed by the formation of an additional conducting layer of grid material that can be oxidised at low temperature, for example titanium nitride 64 and a layer of polycrystalline silicon 66. The titanium nitride increases the conductivity of the grids.

Other grid materials that can be oxidised at low temperature can be used; "Midgap" materials (TiN, W), $n^+$ type materials (Sipoly, Nb) or $p^+$ type materials (Sipoly, Ni).

However, the additional layer 64 is not indispensable.

Layers are deposited in a conform manner, for example obtained by a chemical vapour deposition (CVD) process. In other words, the layers uniformly cover the bottom of the groove, cover the pillar 50 and cover the coating layer 40, part of which is shown on the edges of the figure.

The global thickness of the layers is sufficient to entirely fill in the groove 52.

Note that the electrical insulation of the grids with respect to the pillar 50, and also with respect to the bottom of the groove, is achieved by the layer of grid insulating material. Thus, a short circuit between the source layer 12 and the grids is avoided when one of the previous etchings has penetrated the tunnel-insulating layer at the bottom of the grooves, in other words if the etching stop was insufficiently selective. Thus, operation of the transistor is not compromised.

Manufacturing of the grids is followed by planing of the previously deposited layers. For example, this may be a mechanical-chemical polishing made stopping on the coating layer and on the template layer at the top of the pillar. Dummies previously etched in the stack of layers covered by the template layer 24 could be provided outside the transistor-manufacturing region, to facilitate stopping planing. This type of dummy is not shown in the figures.

Figure 8:
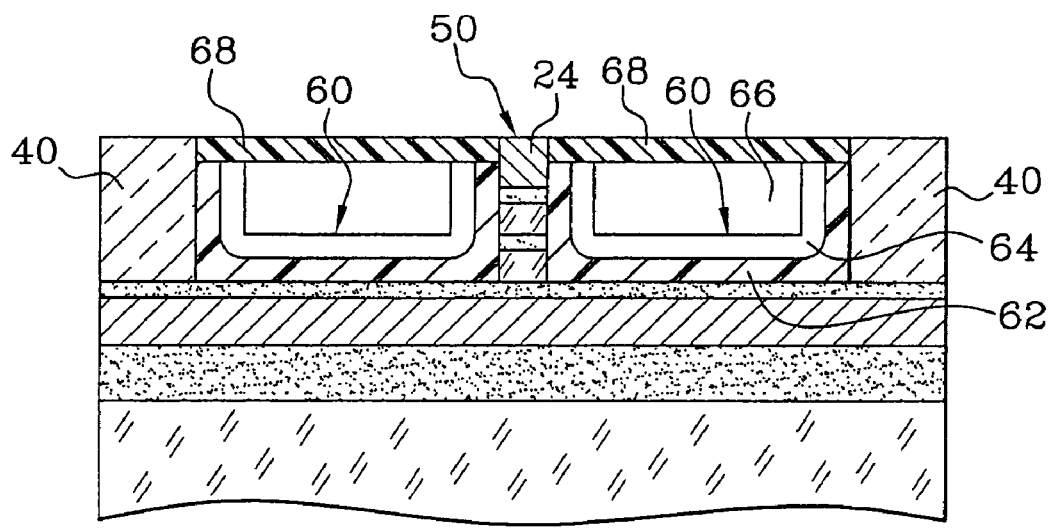
FIG. 8 is a diagrammatic section through the device in FIG. 6 and illustrates completion of the isolated grid.

FIG. 8 shows the grids obtained at the end of planing. They are exposed on the plane of the free surface of the coating layer 40. An electrically insulating surface layer 68 is formed on the surface of the grids. For example, it may be an oxide layer obtained by the oxidation of layers of grid material 66 (and the additional layer 64).

Figure 9:
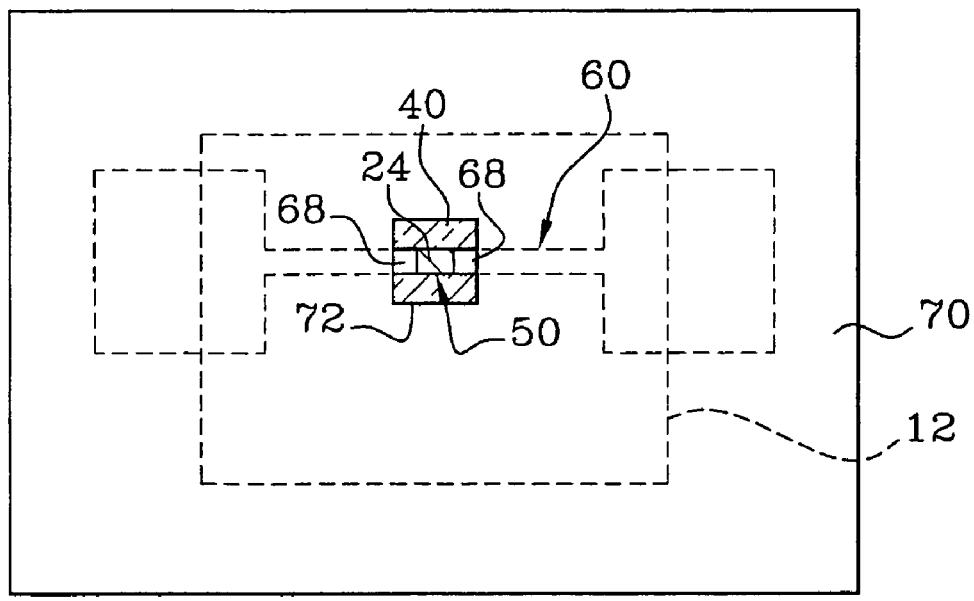
FIG. 9 is an enlarged top view of the device in FIG. 8 and illustrates the formation of a drain access.

FIG. 9 shows the formation of an etching mask 70 on the free face of the device in FIG. 8. The etching mask 70, for example made of resin, is shaped using usual lithography techniques to define an opening 72 in it. The opening is aligned approximately on the region of the device in which the pillar 50 is located. Preferably, the dimensions of the opening are larger than the dimensions of the pillar parallel to the free face of the device. Thus, the alignment of the opening on the pillar is not a critical operation.

Figure 10:
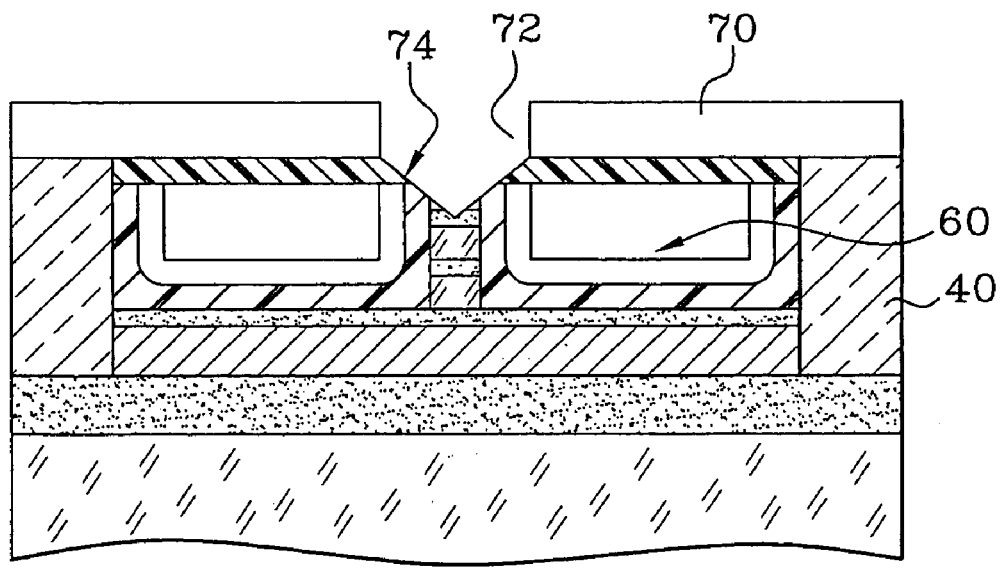
FIGS. 10 and 11 are larger scale diagrammatic sections through a central part of the device in FIG. 8 illustrating preparation of the drain access.

FIG. 10, which is a section comparable to the section in FIG. 8, gives a better view of the relative position of the opening of the mask 70 and the pillar 50. The pillar is etched through the opening of the mask. The etching eliminates the template layer (ref. 24 in FIG. 8) and all or some of a subjacent insulating layer if there one (22i, FIG. 3).

Note that the template layer may also be eliminated by selective etching with respect to the materials exposed on the surface of the device, in fact the electrically insulating surface layer 68 of the grids and the coating layer 40. In this case, the mask formation step illustrated by FIG. 9 is useless.

However, use of the mask enables a wider choice of materials and etching agents for the template layer. Different forms of holes can be obtained depending on the degree of selectivity in the attack of the different layers. In some cases, it may be advantageous to reduce the aspect ratio of the hole. For example, etching of the different materials at approximately equivalent speeds can result in faceting, in other words the formation of facets 74 on the corners of isolated grids, exposed in the opening of the mask. This is shown in FIG. 10.

Figure 11:
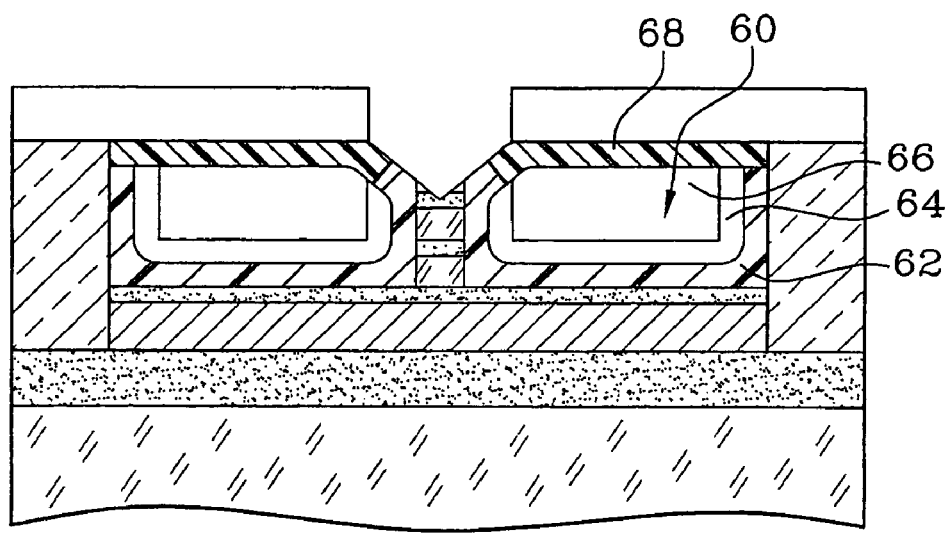

FIG. 11 shows an additional optional step consisting of reoxidising facets at the corners of the exposed isolated grids. This operation prevents conducting layers in the grid from becoming exposed.

The oxidation preferably takes place before the template layer 24 is removed. Furthermore, although the presence of the mask 70 is useful, it is not indispensable. The materials in layers 62, 64, 60, 66 can be oxidised under conditions such that the corners are rounded before the layer 24 is eliminated.

The oxidation operation of the grid material may take place before the template layer 24 is etched, for example in the case in which selectivity with respect to other materials is infinite (no faceting). It may also take place after etching of the template layer 24, particularly when selectivity is not infinite. Finally, oxidation can take place before and after etching of the template layer 24.

For guidance, FIG. 11 shows the limits of the isolated grids that result from a perfectly selective etching of the template layer.

Figure 12:
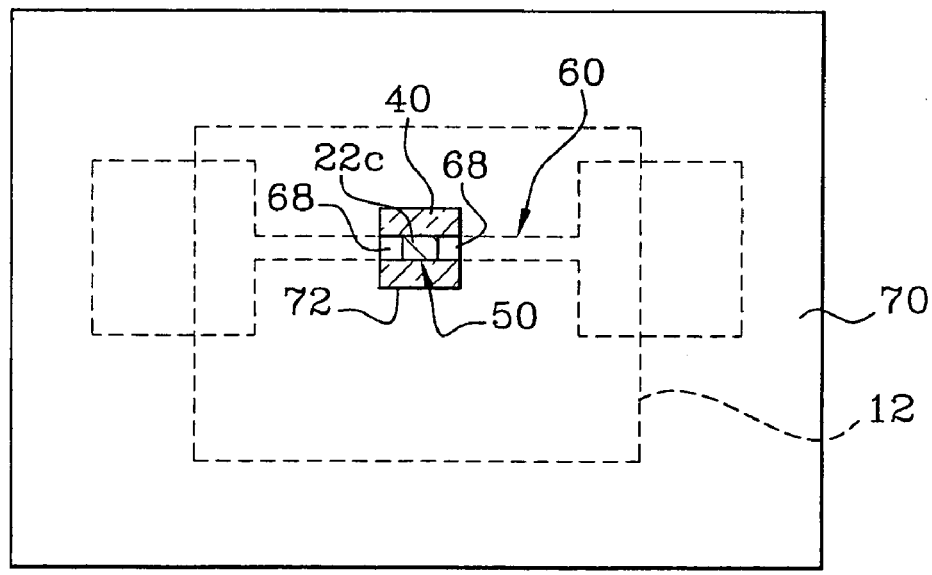
FIG. 12 is an enlarged top view of the device in FIG. 11 and illustrates an additional step in the drain access.

The next step, also optional and illustrated in FIG. 12, consists of selectively eliminating a sacrificial isolating surface layer at the top of the pillar, that was exposed by prior elimination of the template layer. This selective etching step exposes a conducting layer 22c in the stack of the pillar 50.

Figure 13:
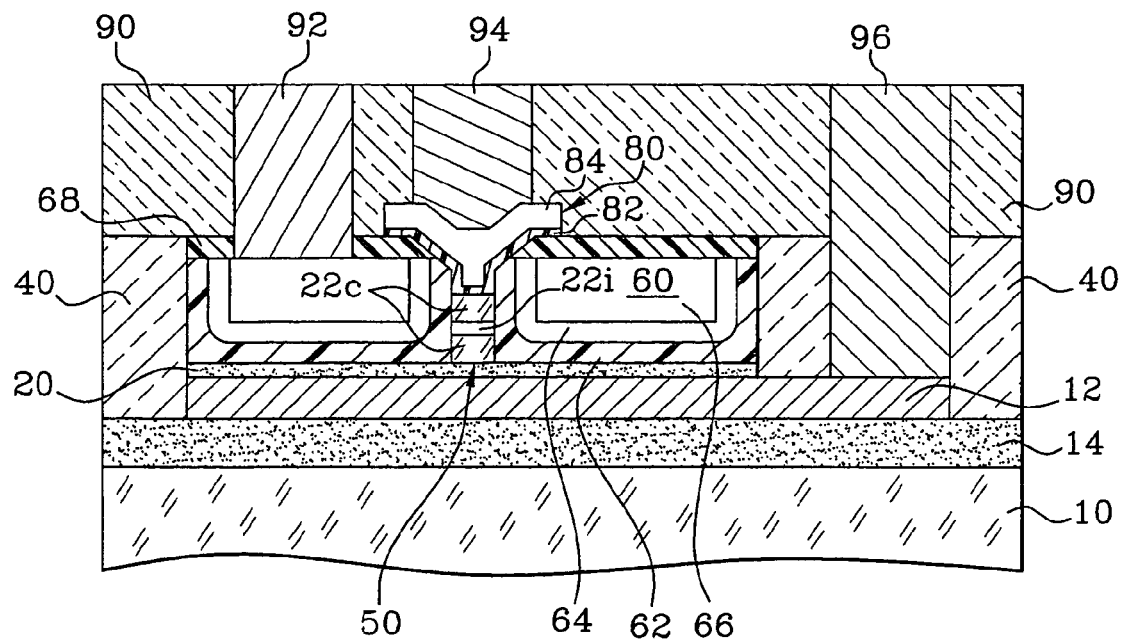
FIG. 13 is a larger scale diagrammatic section through a central part of the device in FIG. 12 and illustrates manufacturing of source, drain and grid connection terminals.

FIG. 13 shows the formation of an isolated drain 80 in the well opened by etchings described with reference to FIGS. 9 to 12. It comprises deposition of tunnel-insulating layer 82 made of a silicon oxide followed by a conducting layer 84, for example made of metal. These layers are shaped to fix the extension of the isolated drain above the electrically insulating surface layer 68.

The fact of making the upper tunnel junction 82 after the essential part of fabrication of the Coulomb blockade transistor according to the invention rather than during manufacture of the alternating stack 22, defined by horizontal and vertical cross etchings shown in FIGS. 4 and 5 respectively, is important. This enables precise control over the thickness and characteristics of this tunnel junction such as its crystalline quality, its physicochemical qualities and the interface. There is no risk of inducing secondary effects that could appear during intermediate steps that take place between deposition of alternating layers of the stack (FIG. 3) and making the upper electrode 80 (FIG. 13). Steps subsequent to the steps described in FIG. 13 are end of process steps that involve lower temperatures and that induce less important secondary effects.

In particular, the process according to the invention enables fine adjustment of the thickness of tunnel junctions.

The surface-insulating layer 22*i* of the pillar can be used as a tunnel insulation for the drain. However, since this layer has already been used as an etching stop layer for the template layer, its thickness may be modified by accidental over etching. The fact of eliminating this layer in the manner suggested in FIG. 12 and replacing it by the new tunnel-insulating layer 82 reduces the risk of accidental direct contact between the drain and a pillar island.

Accessorily, FIG. 13 also shows "encapsulation" of the transistor. A covering material 90, such as undoped silicon oxide, or borophosphosilicated glass, is deposited on the transistor so as to entirely cover the drain 80. The material is then planed to make its outer surface plane. Access wells are etched in the covering material 90 vertically in line with at least one grid, the drain and part of the source layer extending beyond the pillar. The wells are filled with at least one conducting material such as W, TiN, Ti to form access terminals to the grid, drain and source. The terminals are marked with references 92, 94 and 96 respectively in FIG. 13.

Figure 14:
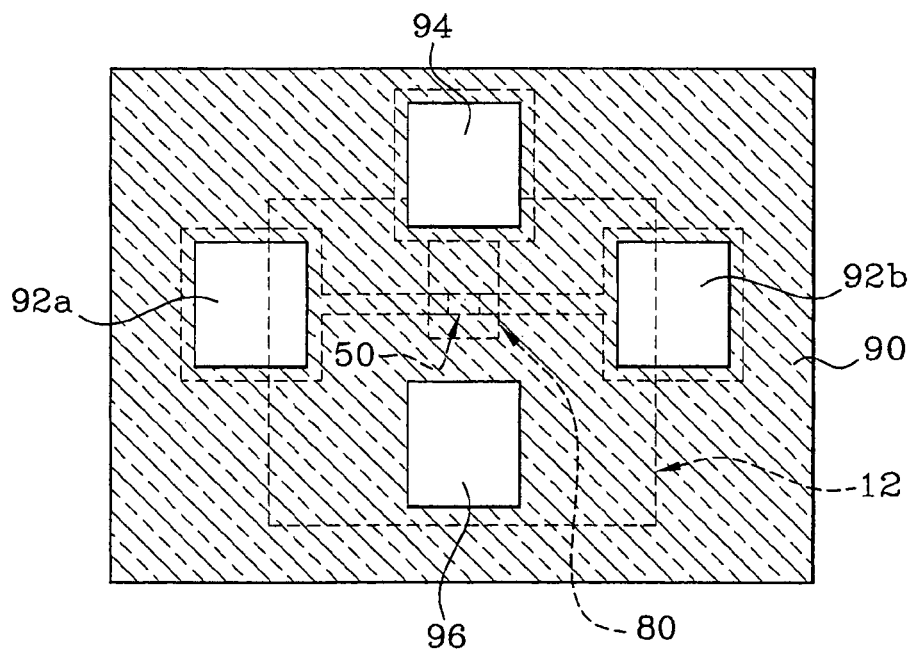
FIG. 14 is an enlarged top view of the device similar to the device in FIG. 13.

FIG. 14 is a top view of the transistor after "encapsulation". It should be noted that the source connection terminal 96 has been brought into the plane of the section in FIG. 13, to simplify the drawing. The real arrangement of this terminal can be seen in FIG. 14.

FIG. 14 shows a minor variant embodiment of the device and shows the drain terminal 94, the source terminal 96 and two grid terminals 92*a* and 92*b*. The two grid terminals correspond to the two parts of the grid on each side of the channel. It can also be observed that the drain terminal 94 is not necessarily above the drain or the pillar, but it may be offset laterally. Finally, the grid terminals 92*a* and 92*b* are not formed on the filiform parts of the grids, but at their widened ends.

Figure 15:
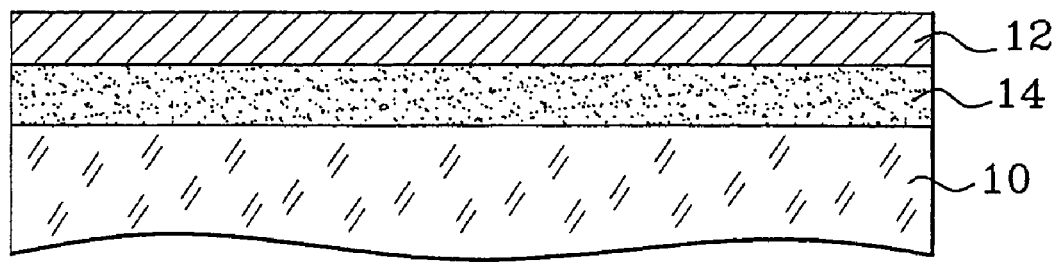
FIG. 15 is a diagrammatic section through a substrate used for manufacturing a transistor according to the invention, according to a process forming a variant to the process illustrated in FIGS. 1 to 14.

FIGS. 15 and subsequent figures described below illustrate another possibility for making a transistor conform with the invention, in other words a transistor with a vertical channel and Coulomb blockade.

Figure 16:
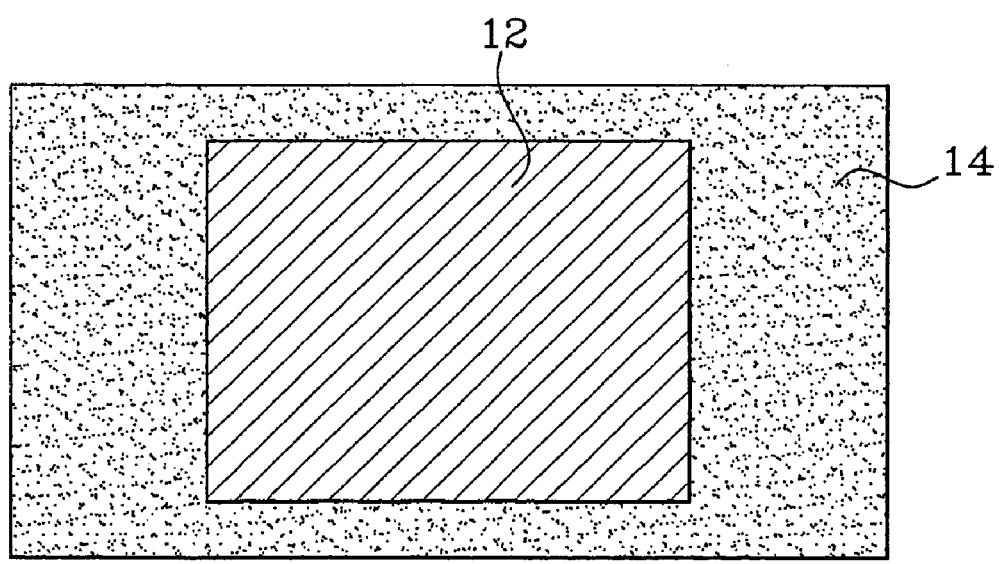
FIG. 16 is a top view of the device in FIG. 15.
Figure 17:
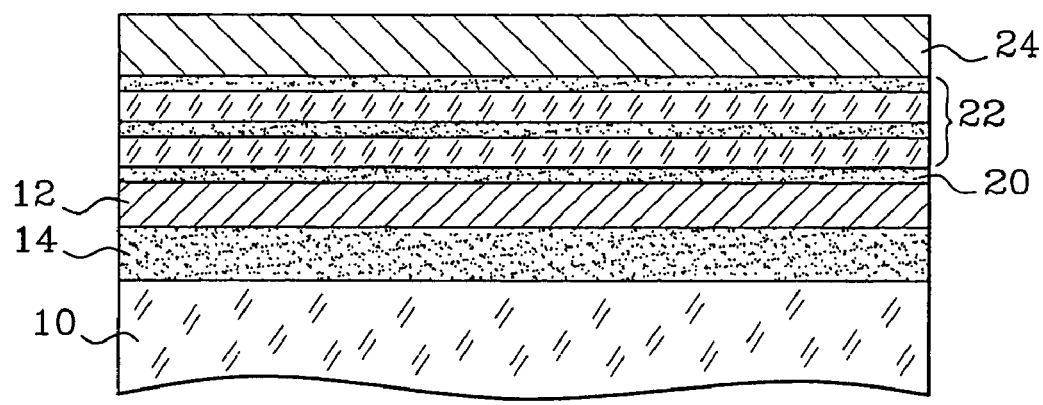
FIG. 17 is a larger scale diagrammatic section through a central part of the device in FIG. 16 on which a stack of layers has been formed.

The manufacturing steps illustrated in FIGS. 15, 16 and 17 are identical to those already described with reference to FIGS. 1 to 3. Thus, refer to the above description.

Figure 18:
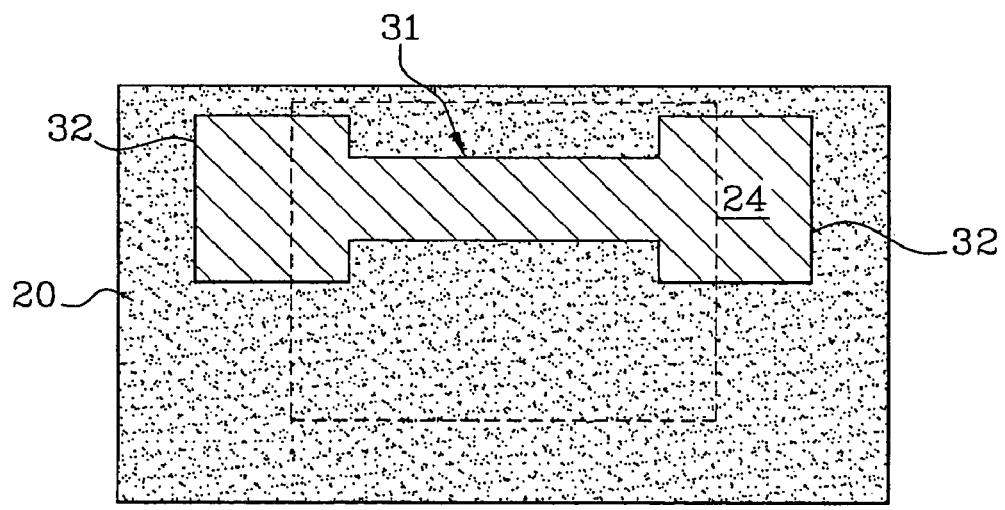
FIG. 18 is an enlarged top view of the device in FIG. 17 after a first etching.

FIG. 18 corresponds to FIG. 4. It illustrates a first etching of the stack of layers stopping on the tunnel-insulating layer 20. However, the first etching is not an final etching in the process illustrated in FIG. 18. It can be observed that the thin tab of the stack in FIG. 4 is a wider band 31 on FIG. 18. The width of the strip 18 may for example be between 100 and 300 nm. Its ends, like the ends of the tab in FIG. 4, are widened. The outer part of the strip 31, after elimination of an etching mask not shown, is formed by the template layer 24.

Figure 19:
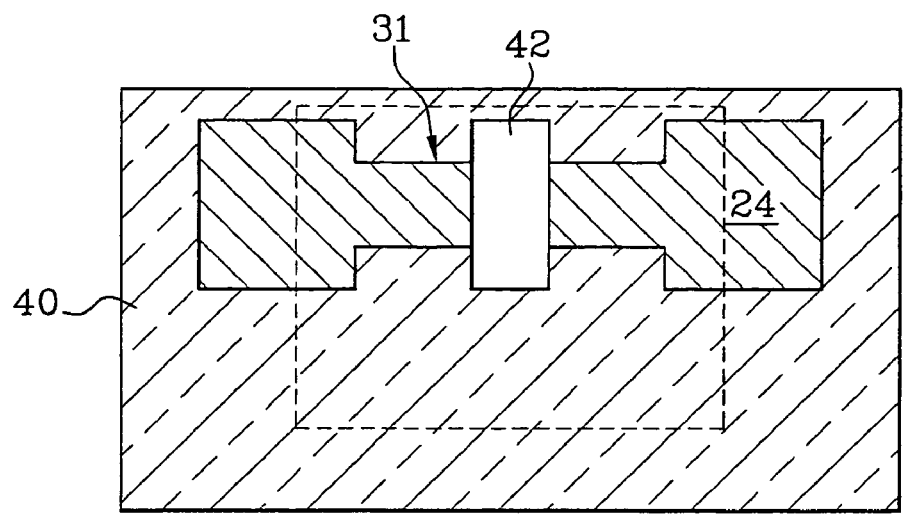
FIG. 19 is a top view of the device in FIG. 18 and illustrates the formation of a second etching mask.

FIG. 19 shows coating of the stack shaped after the first etching. The figure shows the placement of a coating layer 40 of an electrically insulating material and the formation of a second etching mask 42. This second mask is also wider than the second mask described with reference to FIG. 5. Its width is of the same order of magnitude as the width of the strip 31 formed in the stack.

A second etching, which is not a final etching, forms a column 51 for which the location corresponds to the intersection of the second mask with the strip 31. Except for its dimensions, the column 51 is very similar to the pillar 50 described with reference to FIGS. 6 and 7.

Figure 20:
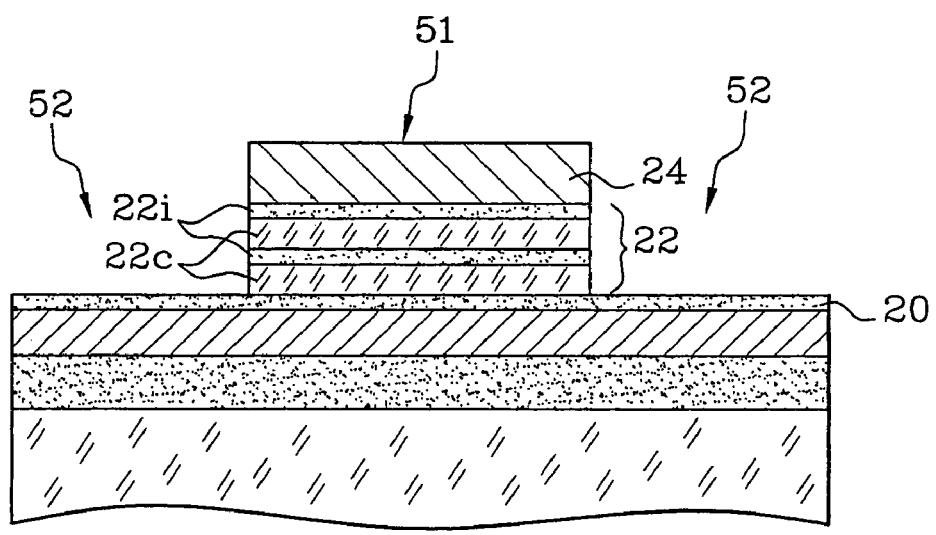
FIG. 20 is a larger scale diagrammatic section through a central part of the device in FIG. 19 and illustrates the formation of a column in the stack of layers.

FIG. 20 is a diagrammatic section through a central part of the device in FIG. 19, and shows the column 51 at larger scale. The column 51 includes an alternating stack 22 of insulating layers 22*i* and "conducting layers" 22*c* and the template layer 24. The insulating layer 22*i* that is immediately under the template layer is a sacrificial layer that can possibly be replaced in the remainder of the process by another tunnel insulating layer.

Reference 52 once again denotes a groove that extends from one side of the column to the other.

Figure 21:
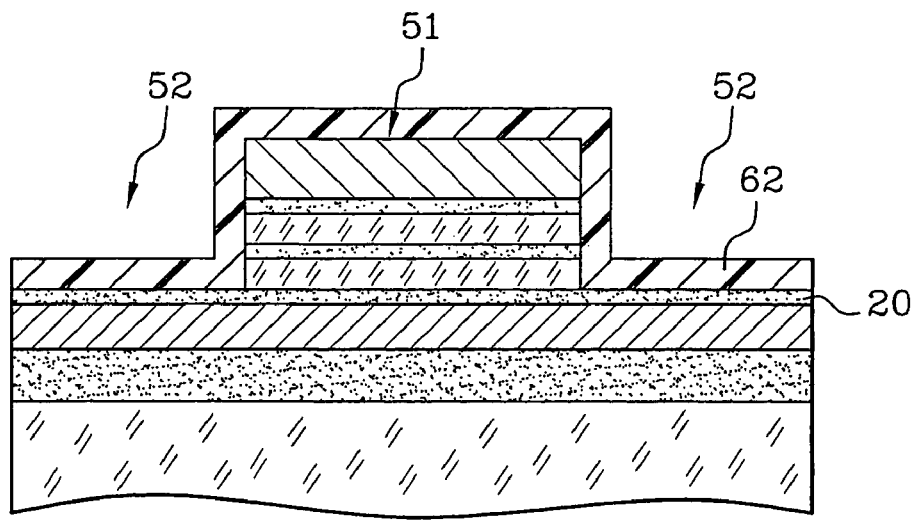
FIGS. 21 to 24 are diagrammatic sections through the device in FIG. 19 and illustrate the manufacture of isolated grids on the flanks of the column.

FIG. 21 illustrates the deposition of a grid-insulating layer 62 that covers the column 51 and the tunnel-insulating layer 20 at the bottom of the grooves, in a conform manner. For example, it may be a silicon oxide layer of the order of 8 nm thick. In the same way as the grid-insulating layer 62 that can be seen in FIG. 7, it can overcome a possible fault or over etching of the tunnel-insulating layer 20.

The deposition of the grid-insulating layer 62 is continued by deposition of one or several grid materials. In the example in FIG. 22, a layer 66 of titanium nitride, polycrystalline silicon or another grid material of the "Midgap", $N^+$ or $P^+$ type is deposited. Like the process described with reference to FIG. 7, the grid 60 may also be formed from two or more conducting or semi-conducting layers.

Figure 22:
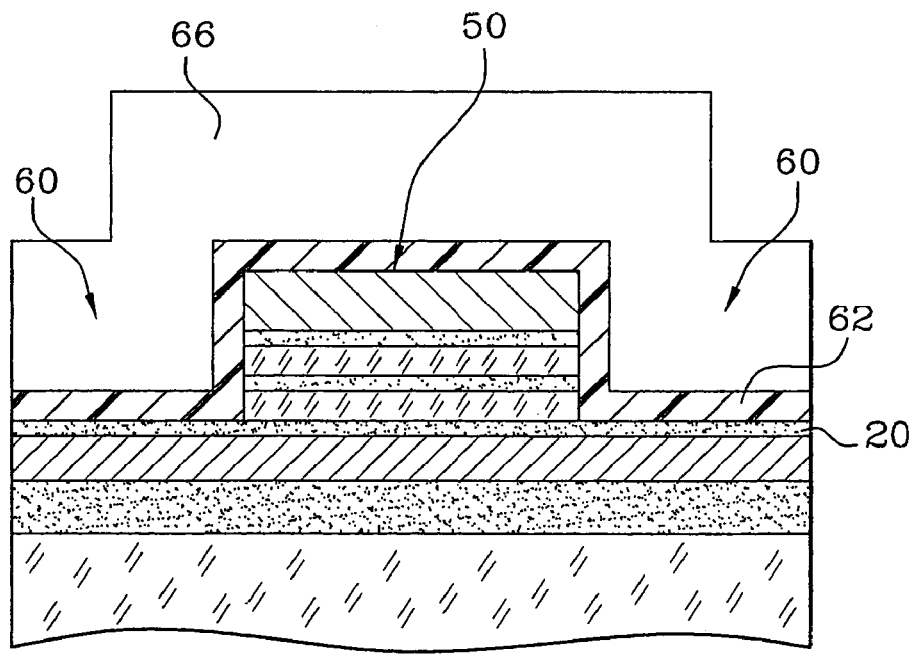
Figure 23:
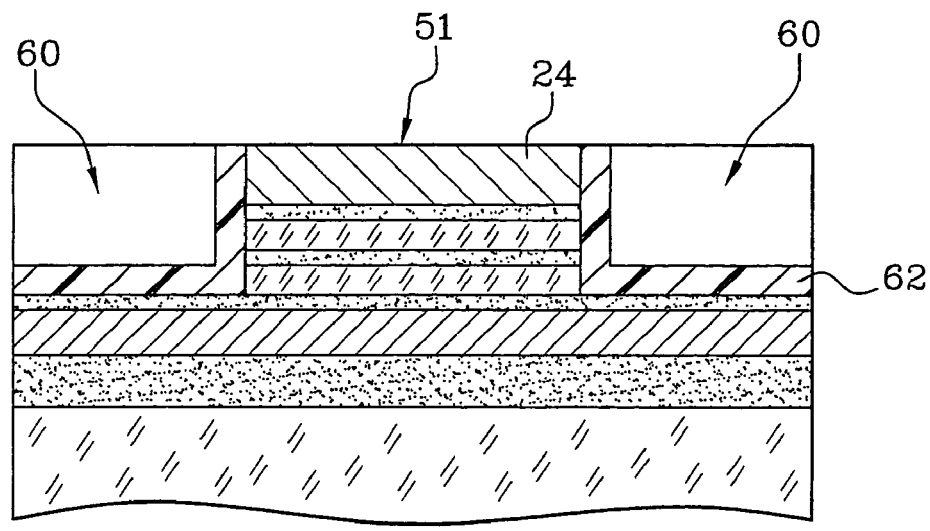

As shown in FIG. 22, the total thickness of the layers deposited for the formation of isolated grids is sufficient to fill in the groove 52 entirely.

Planing, for example done by mechanical-chemical polishing, is intended to make the upper surface of the structure plane where the template layer 24 made of silicon nitride is exposed. This is located at the top of the column 51. The template layer, and any dummies not shown, are used as planing stops, such that the grid-insulating layer is eliminated above the template layer.

Figure 24:
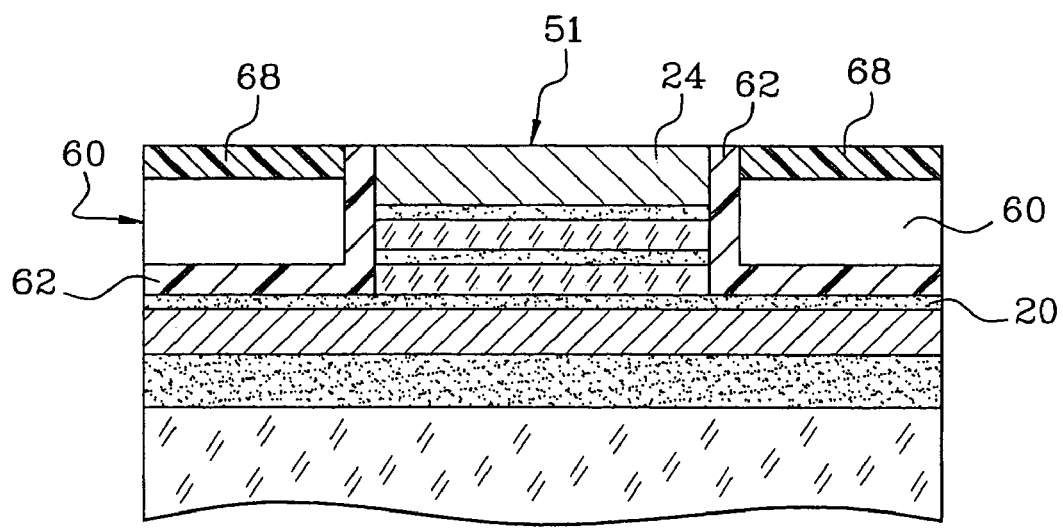

FIG. 24 shows the formation of an electrically insulating surface layer 68 at the surface of the grids 60. This may be formed simply by surface oxidation of the grid material.

Figure 25:
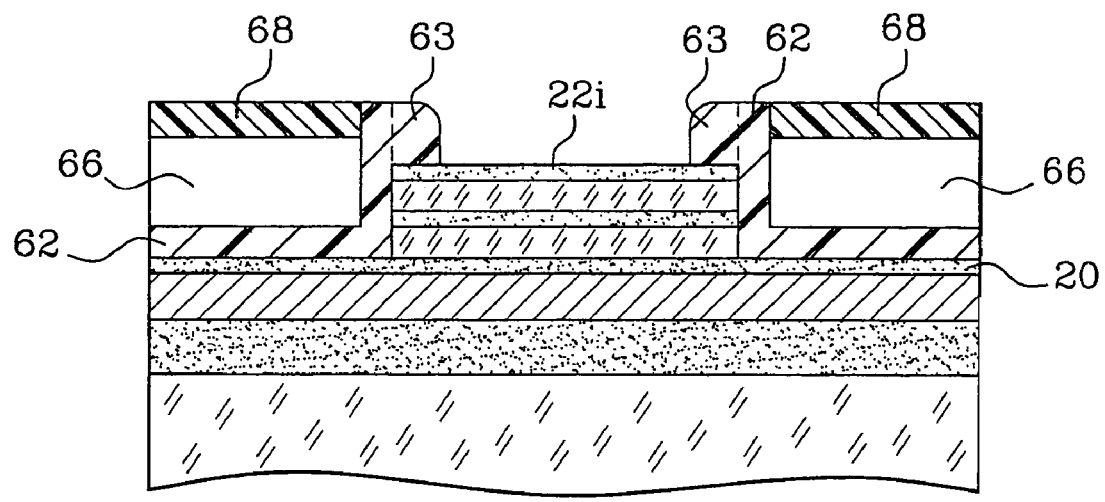
FIG. 25 is a section through the device in FIG. 24 and illustrates the formation of a first spacer.

FIG. 25 shows a step consisting of eliminating the template layer above the column 51 by selective etching. This etching exposes an insulating surface layer 22*i* in the stack, also considered as being sacrificial.

After etching, spacers 63 are formed on the flanks of the grid-insulating layer 62. These are flanks vertically in line with the surface-insulating layer 22*i* and exposed during elimination of the template layer.

Conventionally, formation of the spacers includes the deposition of an electrically insulating material such as silicon oxide, for example, followed by anisotropic etching of this material until it is fully eliminated on the faces parallel to the substrate layers.

The lateral extension of spacers 63 above the column 51 may be adjusted to very low values of the order of a few nanometers. This small overlap is used as an etching mask for a subsequent anisotropic etching.

Figure 26:
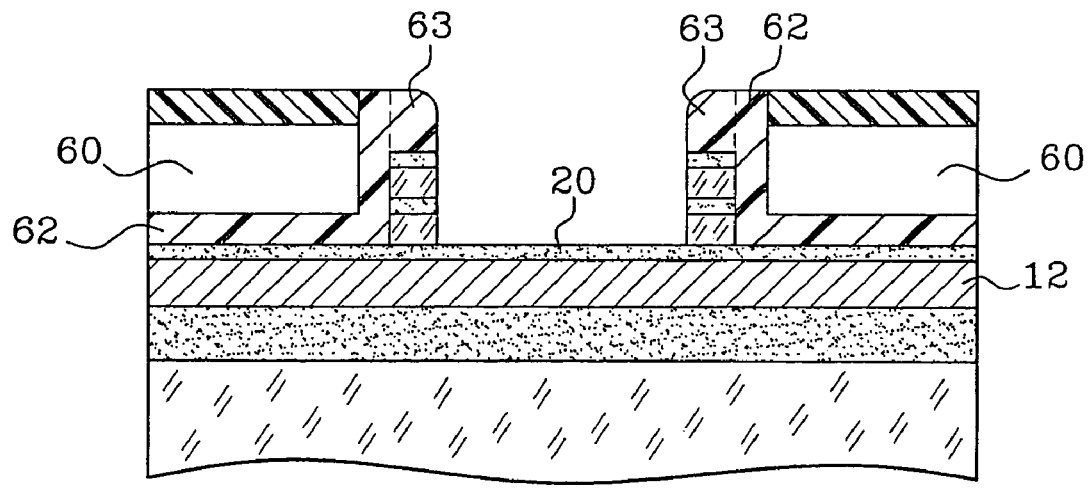
FIG. 26 is a section through the device in FIG. 25 and illustrates a second etching of the column.

The result of final etching done in this example, stopping on the tunnel-insulating layer 20 that covers the source layer 12, is illustrated in FIG. 26. The lateral extension of the spacers 63 is chosen to be just sufficient to not entirely eliminate layers of the stack under the spacers. The remaining part of the column under the spacers is comparable to two small walls shown in section in FIG. 26.

Figure 27:
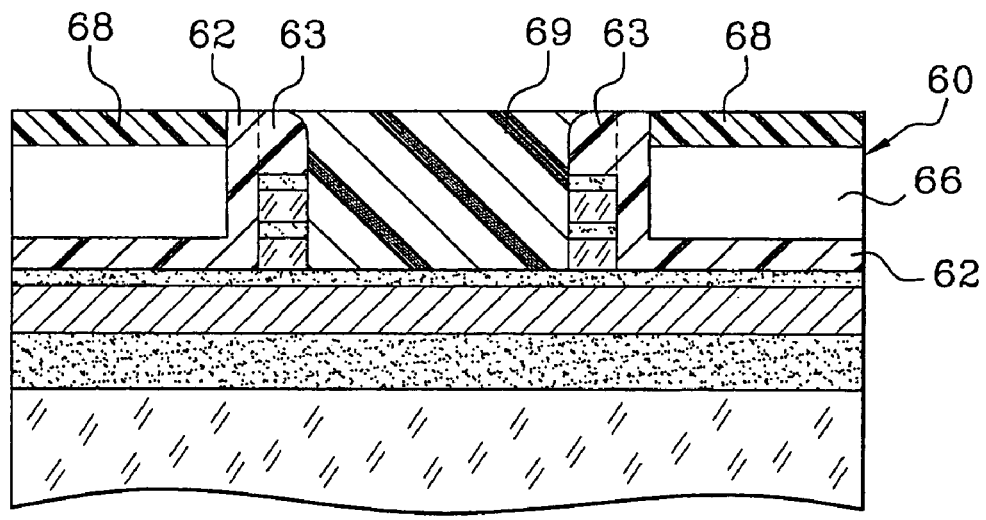
FIG. 27 is a diagrammatic section through the device in FIG. 26 and illustrates a step for isolating and protecting a remaining part of the column.

The depression formed by the etching between the grids is filled in by a block of insulating material shown in FIG. 27. Preferably it is an oxide block, such as silicon oxide formed by deposition and then planing.

Figure 28:
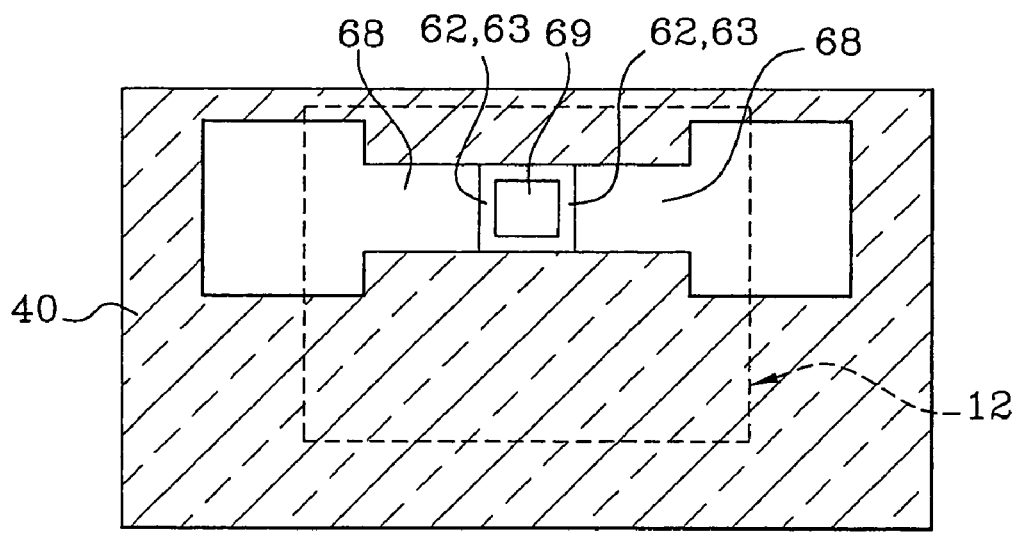
FIG. 28 is an enlarged top view of the device in FIG. 27.

FIG. 28 is a more global top view, showing the relative layout of the coating material 40, the surface-insulating layer 68 covering the grids, the oxide block 69 and the grid-insulating layer 62 flanked by spacers 63.

Figure 29:
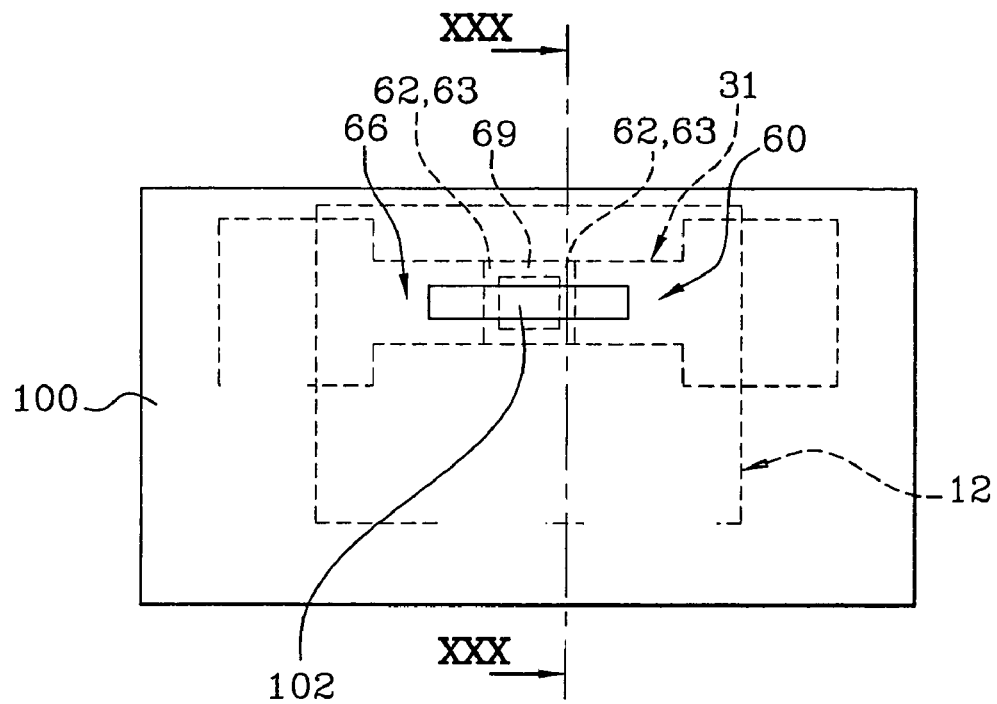
FIG. 29 is a top view of the device in FIG. 28 and illustrates a step in the formation of a sacrificial pad.

FIG. 29 shows the formation of a sacrificial layer 100 on the upper face of the device in FIG. 28. For example, it may be a polysilicon layer.

A resin mask 102 is formed on the sacrificial layer. This is a mask extending from one side of the oxide block 69 to the other, and spacers 63, going as far as above the grids 60. The mask 102 is preferably centred with respect to the extension of the spacers 63 perpendicular to the strip 31. It is also slightly narrower than the strip 31 mentioned with reference to FIG. 20, in other words slightly narrower that the spacers 63.

The resin mask is used as an etching mask to shape the sacrificial layer 100.

After etching the sacrificial layer, the result is a sacrificial pad that is marked with the same reference 100 as the layer, for convenience reasons.

Figure 30:
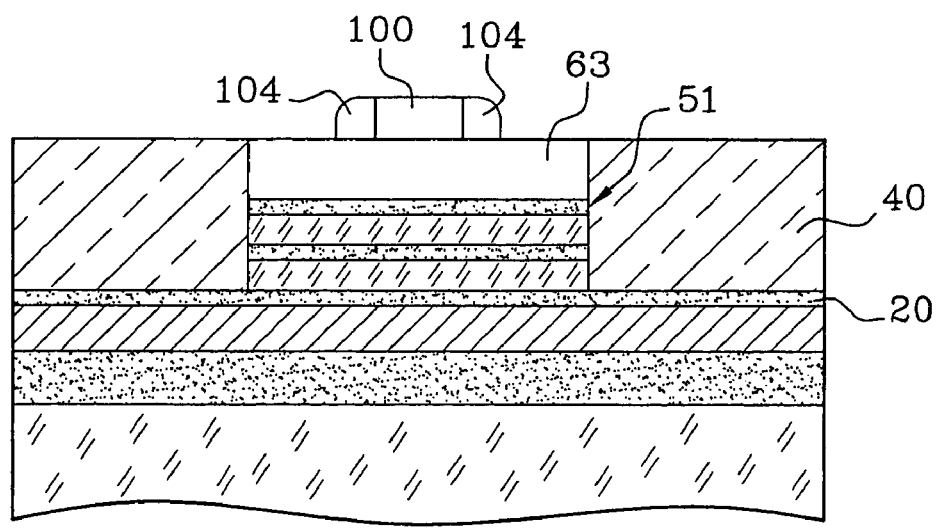
FIG. 30 is a larger scale diagrammatic section through a part of the device in FIG. 19 and illustrates the formation of spacers on the sacrificial pad.

FIG. 30 is a section XXX—XXX through the device in FIG. 29 along a spacer 63. It shows the remainder of the column 51, in other words the small wall of the initial stack remaining under the spacer, and the relative position of the sacrificial pad 100. The sacrificial pad in this case is seen in section after elimination of the resin mask.

FIG. 30 also shows that the lateral flanks of the pad are also lined with spacers 104. For example, these spacers may advantageously be made of silicon oxide, SiC or TiN, also formed by deposition then anisotropic etching of the material. The pad dimensions are adjusted such that the pad spacers 104 are arranged above the spacers 63 of the grid insulation, by crossing them.

Figure 31:
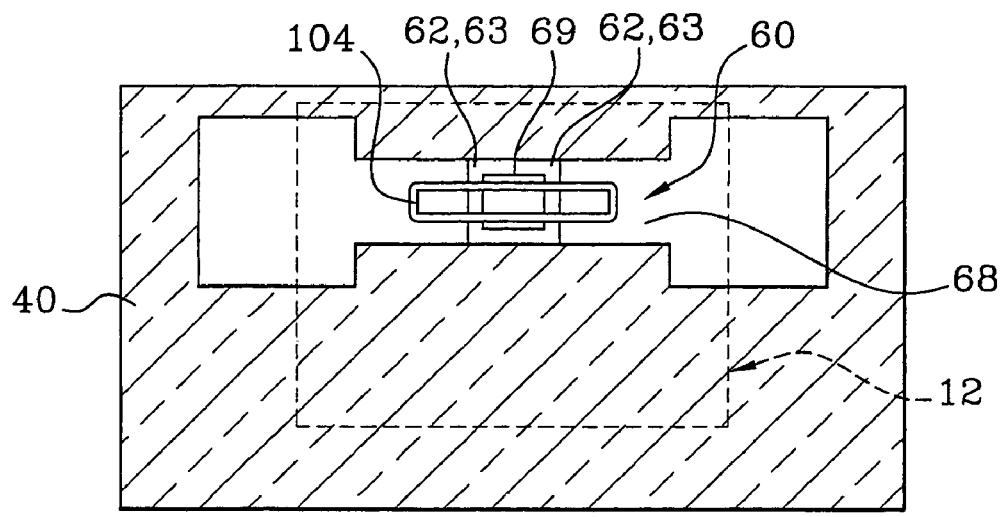
FIG. 31 is an enlarged top view of the device in FIG. 30 and illustrates the withdrawal of the sacrificial pad.

FIG. 31 shows a top view of the device after selective elimination of the sacrificial pad and more clearly shows the crossing of the spacers 63 and 104.

Figure 32:
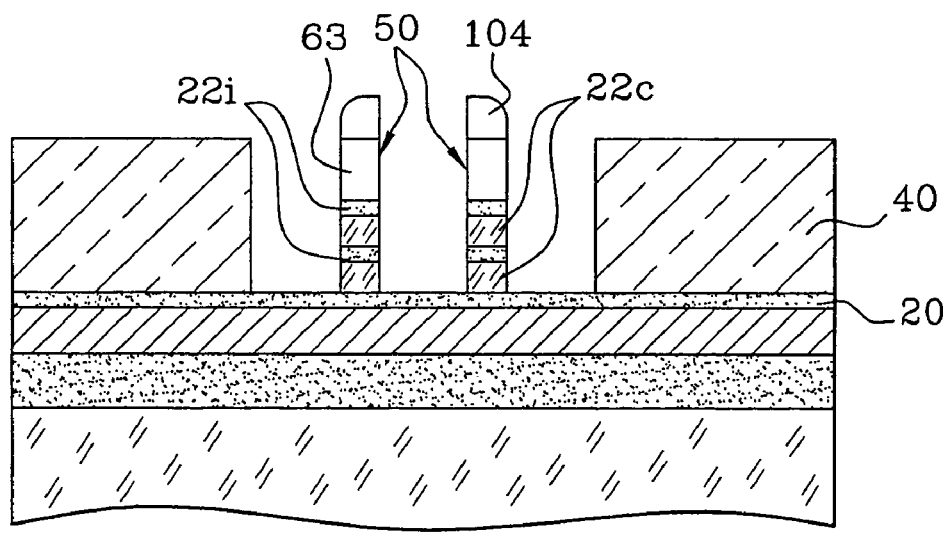
FIG. 32 is a larger scale diagrammatic section of a central part of the device in FIG. 31 and illustrates a new etching for the formation of pillars in the remaining part of the column.

After the sacrificial pad has been eliminated, the next step is a new selective etching of the stack layers, and more precisely of the remainder of the column 51, using the spacers 104 of the sacrificial pad as an etching mask. During this etching, the unprotected parts of the spacers 63 of the grid-insulating layer are also eliminated. The coating layer 40 is always kept. The result of this etching can be seen in FIG. 32 that corresponds to the same section plane as FIG. 30. It releases four pillars 50, only two of which are visible in the figure.

Figure 33:
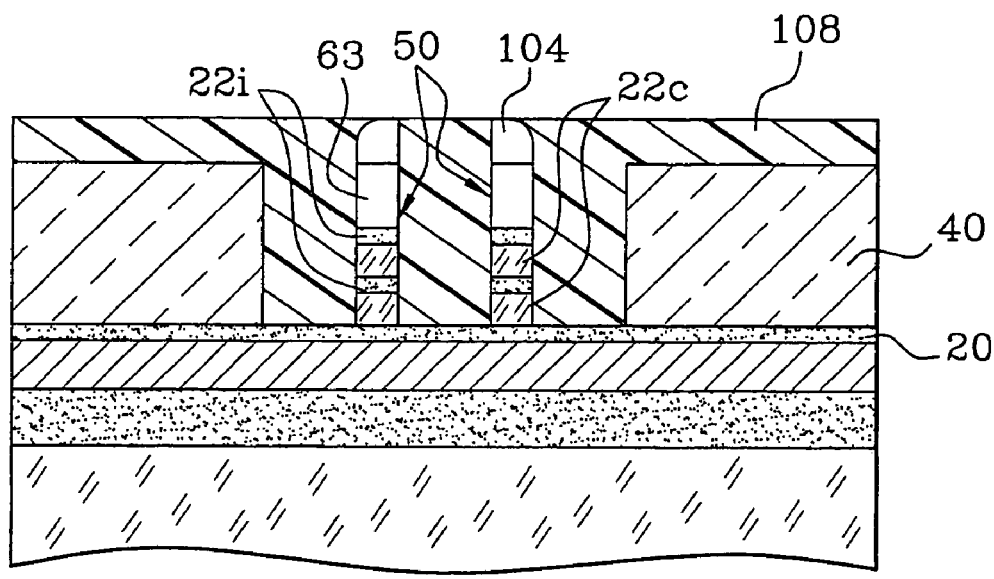
FIG. 33 is a diagrammatic section through the device in FIG. 32 and illustrates coating of the pillars.

An oxide deposit 108 followed by planing consolidate the pillars while electrically insulating them. These operations are illustrated in FIG. 33.

Figure 34:
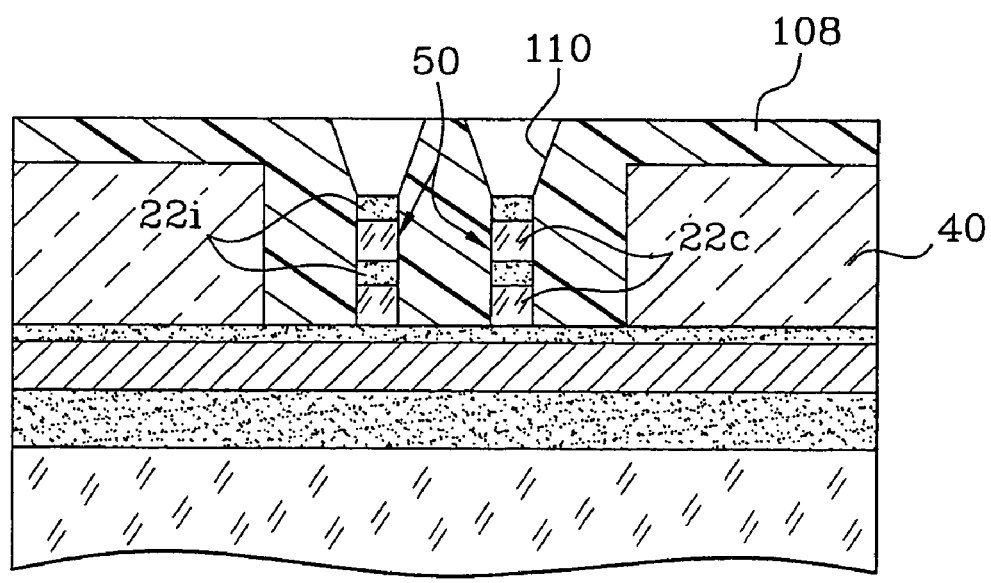
FIGS. 34 to 36 are diagrammatic sections through the device in FIG. 33 and illustrate preparation of the grid access on the pillars.

FIG. 34 illustrates selective etching to eliminate the spacer 104 from the sacrificial pad and the subjacent part of the spacer 63 in the grid-insulating layer. Limited selectivity of etching results in flared wells 110 above the pillars 50.

As in the previous embodiment, it is preferable to precisely control the thickness of the tunnel-insulating layer that separates the drain from the channel.

Figure 35:
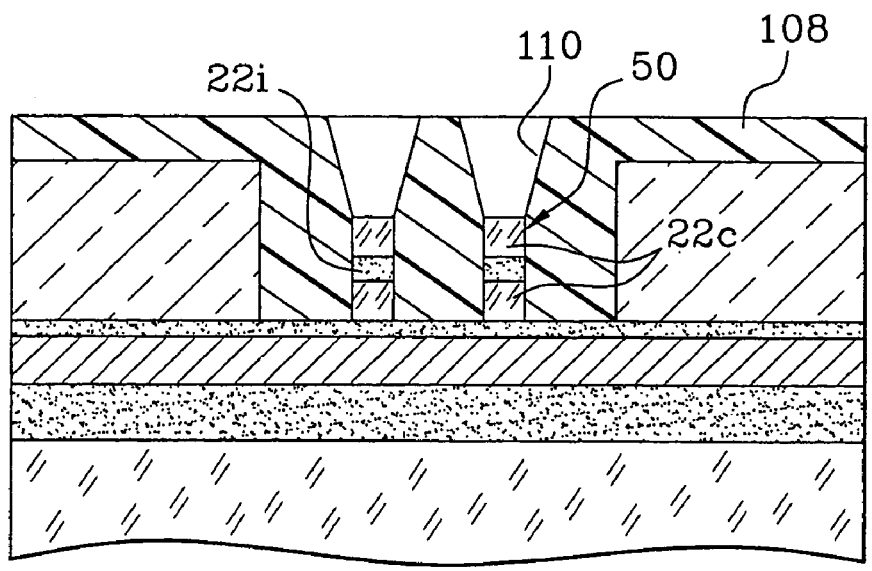

This is done by eliminating a possible surface-insulating layer in the pillar stack to expose one of the thin conducting layers 22c. In the example illustrated, the objective will be to eliminate the insulating layer at the top of the stack and considered to be sacrificial, as shown in FIG. 35. Note that when the last insulating layer at the top of the pillars is to be replaced, it can be made slightly thicker than the other layers of the stack to make it the best etching stop layer for the formation of wells 110.

Figure 36:
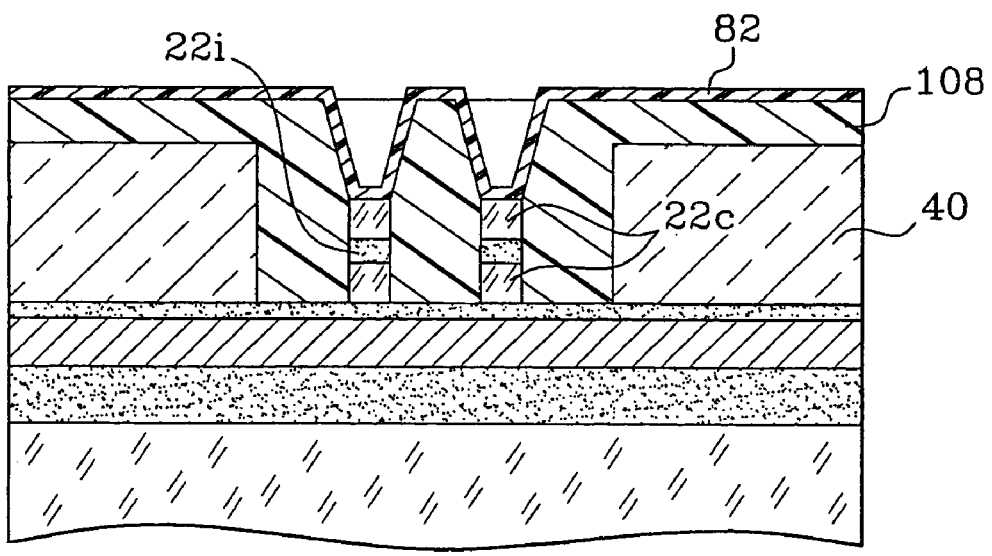

FIG. 36 shows the deposition of a new tunnel-insulating layer 82 for which the thickness is perfectly controlled to form a tunnel junction above the conducting layer 22c of the previously exposed pillars. The tunnel insulating layer, for example a layer of $SiO_2$, extends in the flared wells, and if applicable, onto the oxide layer 108 formed for mechanical consolidation of the pillars 50.

Figure 37:
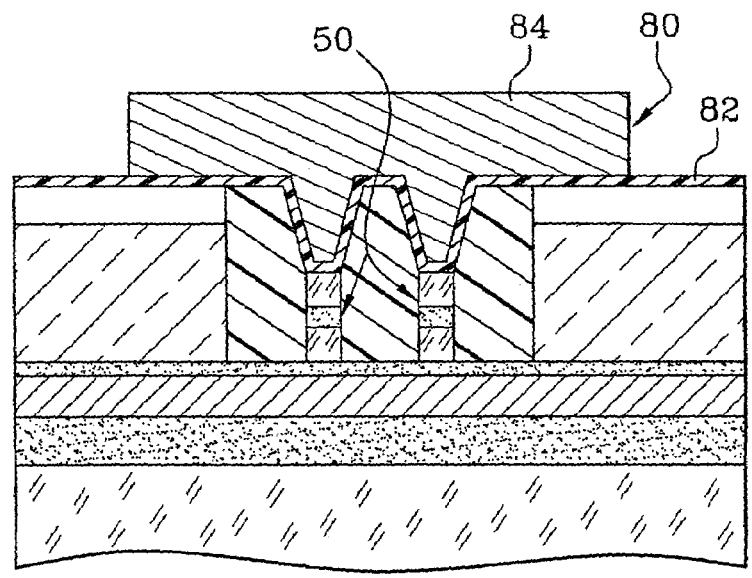
FIG. 37 is a diagrammatic section through the device in FIG. 36 and illustrates the formation of a drain.

FIG. 37 shows the formation of a drain by deposition and then formation of a conducting layer 84.

The assembly composed of the tunnel-insulating layer 82 and the conducting layer 84 forms an isolated drain marked by reference 80, by analogy with FIG. 13.

In the example illustrated, a single isolated drain is associated with the four transistor channels corresponding to the four pillars 50. However, the drain can be split into two or four mutually isolated drains to form four transistors with a common source. However, the same grid is associated with two channels each time, and therefore with two transistors.

Figure 38:
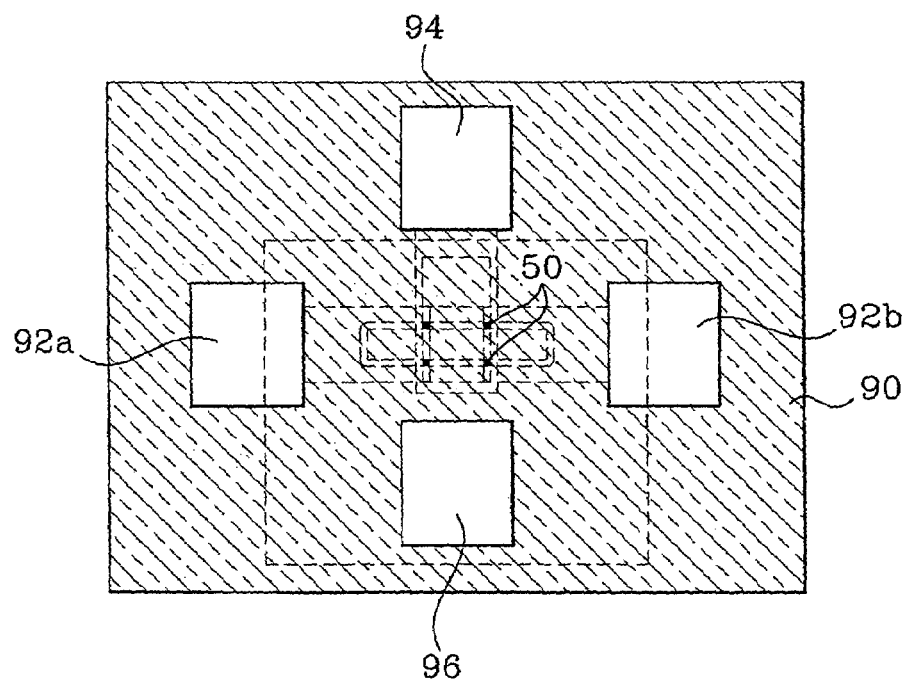
FIG. 38 is an enlarged top view of the device in FIG. 37 and illustrates a step for isolating and forming the contact terminals.

FIG. 38, like FIG. 14 described above, shows the transistor obtained after "encapsulation" under a cover layer (90). The figure shows a drain terminal 94 connected to the four pillars 50, and a grid terminal 92a associated with the grid of the left pillars in the figure, and a grid terminal 92b associated with the grid of the right pillars in the figure, and a source connection terminal 96.

We will now describe a variant of the above process that includes all steps described with reference to FIGS. 15 to 30 identically.

Figure 39:
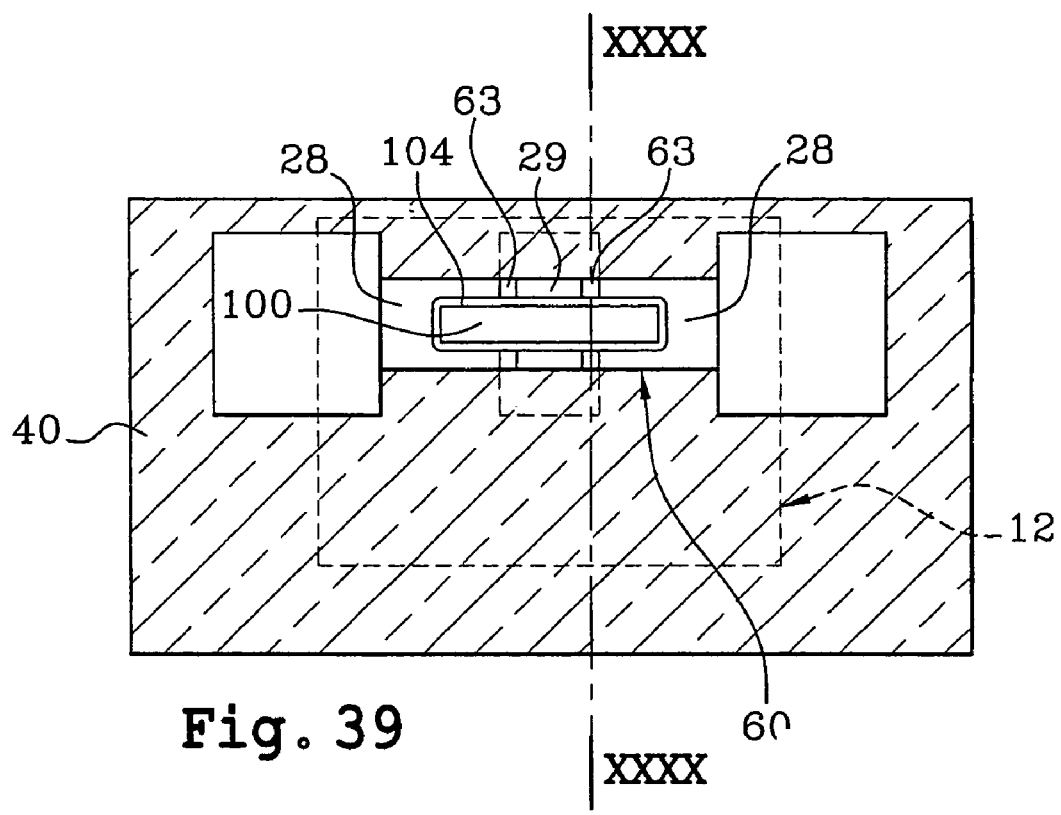
FIG. 39 is a top view of the device in FIG. 30.

FIG. 39 is a top view of the device in FIG. 31. It shows that the sacrificial pad is not eliminated, unlike the process in FIG. 32.

Figure 40:
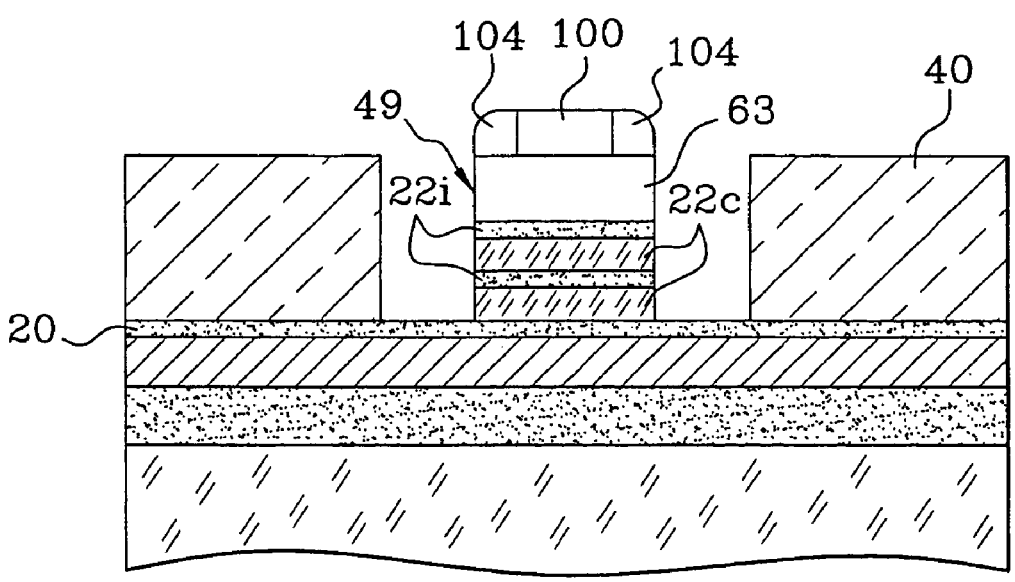
FIG. 40 is a larger scale diagrammatic section through a central part of the device in FIG. 38 and illustrates etching of the column according to a variant of the process in FIG. 32.

A selective anisotropic etching of the remaining part of the column takes place using the sacrificial pad 100 and the lateral spacers 104 of the pad as etching masks. Etching, stopping on the tunnel-insulating layer 20, cuts out a small wall 49 in the remaining stack as shown in FIG. 40. FIG. 40 is a section XXX—XXX through the device in FIG. 39 along one of the spacers 63.

Figure 41:
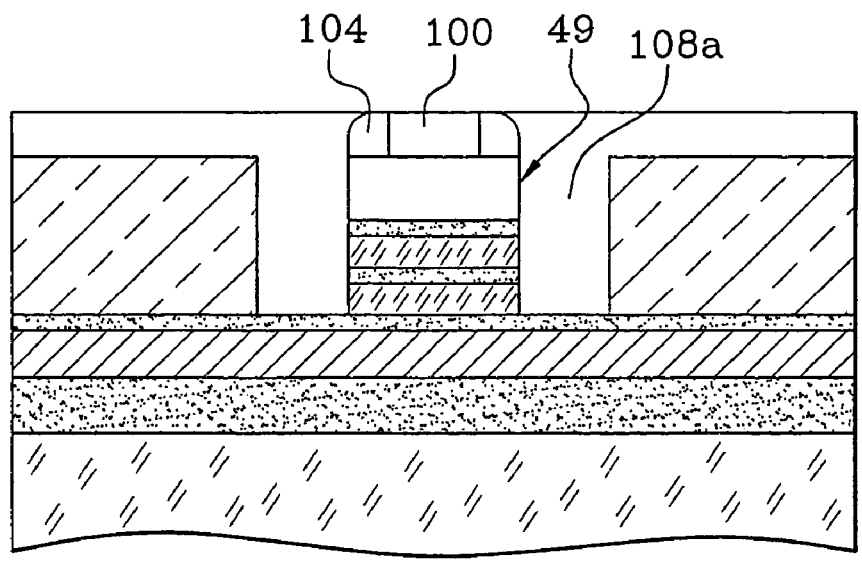
FIG. 41 is a diagrammatic section through the device in FIG. 40 and illustrates a step in coating the remaining part of the column.

FIG. 41 shows consolidation of the small wall by an insulating layer 108a, for example made of an oxide. This operation is followed by elimination of the sacrificial pad and by a new selective anisotropic etching. The second etching only uses the spacers 104 of the sacrificial pad 100 as an etching mask. The result is then pillars 50 identical to those in FIGS. 32 and 33.

Figure 42:
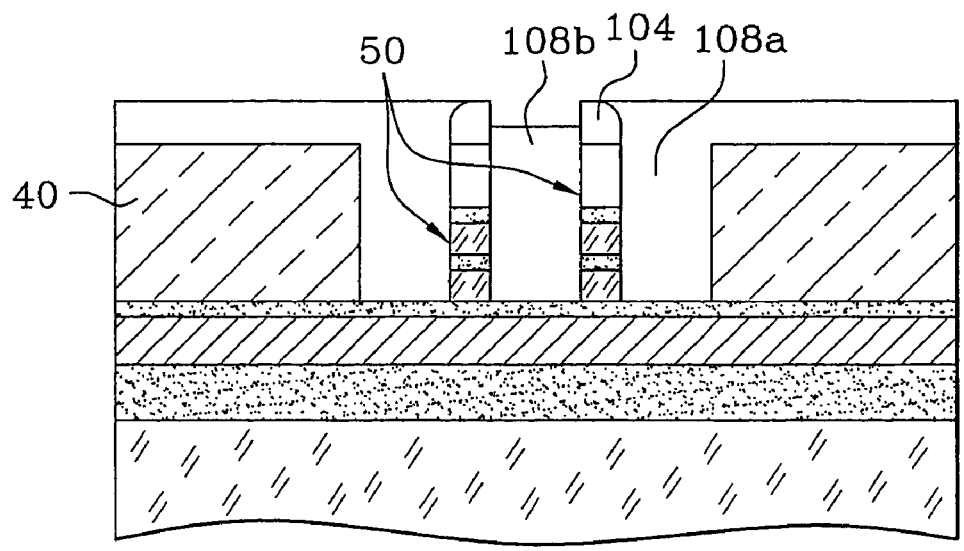
FIG. 42 is a diagrammatic section through the device in FIG. 41 and illustrates etching of pillars.

As shown in FIG. 42, these pillars are consolidated by a new insulating layer 8b. Finally, the layers 108a and 108b perform the same function as layer 108 in FIG. 33.

The variant described herein and that is equivalent to etching pillars in two steps with an intermediate mechanical stiffening, largely reduces the risk of accidental breakage of the pillars that have a small cross section.

Documents Mentioned (1) "Fabrication and electron transport in multilayer silicon-insulator-silicon nanopillars"
David M. Pooley and Haroon Ahmed
J. Vacc. Sci. technol. B 17 (No.6), November/December 1999, pp. 3235–3238

(2) "Enhancement of Coulomb Blockade and tunability by multidot coupling in a silicon-on-insulator-based single-electron transistor"
J. W. Park, K. S. Park, B. T. Lee, C. H. LEE, S. D. Lee and Jung B. Choi
APPLIED PHYSICS LETTERS, Vol. 75, No. 4, 26 Jul. 1999, pp. 566–568

(3) "Coulomb Blockade in silicon nano-pillars"
D. M. Pooley and H. Ahmed
APPLIED PHYSICS LETTERS, vol. 74, No. 15, 12 Apr. 1999, pp. 2191–2193

What is claimed is:

1. Process for manufacturing a Coulomb blockade transistor comprising the following on a substrate:
a stack of channel layers (22, 22i, 22c) forming at least one quantum box,
a source (12) and a drain (80, 82, 84) connected to the quantum box through tunnel junctions, at least one of which is distinct from the layers of the stack, and is stacked with the channel layers,
at least one grid (60) facing at least one flank of the stack,
the stack of layers comprising at least one nanometric conducting island (22c) arranged between the electrically insulating layers (22i),
the process comprising the following steps in sequence:
deposition on an insulating substrate of a source layer (12), a tunnel-insulating layer (20) and an alternating stack of at least one conducting layer (22c) and at least one insulating layer (22i),
a first etching of the stack to form a filiform tab (30),
coating of the filiform tab with an electrically insulating coating material (40),
a second etching of the tab of the stack to form a pillar (50), the second etching preserving the coating material (40) to define a groove (52) on each side of the pillar (50),
the formation of at least one isolated grid (60) in the groove (52),
the formation of a drain (84) in contact with one end of the pillar opposite the source layer, through at least one tunnel-insulating layer (82).

2. Process according to claim 1, also including the formation of connection terminals (92a, 92b, 94, 96) on the source layer, the grid, and the drain.

3. Process according to claim 1, in which formation of the isolated grid includes deposition of a grid-insulating material (62), and a grid material (66) in the groove (52), and then making these layers plane and stopping on the pillar.

4. Process according to claim 3, in which the first final etching is done following a template layer (24) and at least one portion of the template layer (24) is kept on the pillar during the second final etching, and in which planing takes place on the portion of the template layer.

5. Process for manufacturing a Coulomb blockade transistor comprising the following on a substrate:
a stack of channel layers (22c, 22i, 22c) forming at least one quantum box,
a source (12) and a drain (80) connected to the quantum box through tunnel junctions, at least one of which is distinct from the layers of the stack, and stacked with the channel layers,
at least one grid (60) facing at least one flank of the stack,
the stack of channel layers comprising at least one nanometric conducting island (22c) arranged between electrically insulating layers (22i),
the process comprising the following steps in sequence:
deposition of a source layer (12), a tunnel-insulating layer (26) and an alternating stack of at least one conducting layer (22c) and at least one insulating layer (22i), on an insulating substrate,
a first etching of the stack according to a template layer (24) to form a strip (31),
coating of the strip with an electrically insulating coating material (40),
a second etching of the strip (31) in the stack to form a column (51), the second etching preserving the coating material (40) to define a groove (52) on each side of the column (51), and the second etching protecting a part of the template layer (24) on the column (51),
formation of at least one isolated grid (60) in the groove (52),
withdrawal of the template layer (24) to expose part of the isolated grid and formation of at least one spacer (63) extending partially onto the column (51), in contact with the isolated grid,
etching of the column (51), using the spacer (63) as an etching mask, so as to preserve at least part of the column (51) located under the spacer,
cutting of pillars (50) in the preserved part of the column, isolating the pillars, and
formation of at least one drain (84) in contact with at least one end of a pillar, opposite the source layer, through at least one tunnel-insulating layer (82).

6. Process according to claim 5, in which cutting of pillars (50) includes:
formation of a sacrificial pad (100) of mask material above the preserved part of the column, with at least one flank located above an edge of at least one pillar to be formed,
formation of at least one spacer (104) on the flank of the sacrificial pad (100),
etching of the preserved part of the column (51), using the spacer of the sacrificial pad as an etching mask, to preserve at least one pillar (50) under the spacer.

7. Process according to claim 6, in which the sacrificial pad (100) is eliminated before etching of the preserved part of the column (51).

8. Process according to claim 6, in which etching of the preserved part of the column comprises:
a first etching using the sacrificial pad (100) and the spacer (104) of the pad as the etching mask,
consolidation of the remaining part of the column by an electrically insulating material (108a),
elimination of the sacrificial pad (100), preserving the spacer (104) of the sacrificial pad, and
a second etching using the spacer (104) of the sacrificial pad as a mask to define at least one pillar (50).

* * * * *